US012249675B2

(12) United States Patent
Uchida et al.

(10) Patent No.: US 12,249,675 B2
(45) Date of Patent: Mar. 11, 2025

(54) SEMICONDUCTOR DEVICE

(71) Applicant: CANON KABUSHIKI KAISHA, Tokyo (JP)

(72) Inventors: Tatsuro Uchida, Tokyo (JP); Takayuki Sumida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 478 days.

(21) Appl. No.: 17/342,734

(22) Filed: Jun. 9, 2021

(65) Prior Publication Data
US 2021/0391505 A1    Dec. 16, 2021

(30) Foreign Application Priority Data

Jun. 16, 2020    (JP) .................................. 2020-103581

(51) Int. Cl.
*H01L 33/58* (2010.01)
*H01L 33/38* (2010.01)
*H01L 33/42* (2010.01)

(52) U.S. Cl.
CPC ............ *H01L 33/42* (2013.01); *H01L 33/382* (2013.01); *H01L 33/58* (2013.01)

(58) Field of Classification Search
CPC ........ H01L 33/42; H01L 33/382; H01L 33/58
See application file for complete search history.

(56) References Cited

U.S. PATENT DOCUMENTS

| | | | |
|---|---|---|---|
| 5,578,837 A * | 11/1996 | Jackson | ............ H01L 27/14665 257/E31.115 |
| 6,455,836 B1 | 9/2002 | Hula | |
| 9,224,789 B2 | 12/2015 | Hirose et al. | |
| 9,455,413 B2 | 9/2016 | Hirose et al. | |
| 10,056,570 B2 | 8/2018 | Hirose et al. | |
| 10,566,560 B2 | 2/2020 | Hirose et al. | |
| 10,840,467 B2 | 11/2020 | Hirose et al. | |
| 11,495,762 B2 | 11/2022 | Ujiie et al. | |
| 2006/0044561 A1 * | 3/2006 | Nii | ..................... H01L 27/14647 356/218 |

(Continued)

FOREIGN PATENT DOCUMENTS

| | | |
|---|---|---|
| JP | 3-244155 A | 10/1991 |
| JP | 2002-33471 A | 1/2002 |

(Continued)

OTHER PUBLICATIONS

Notice of Reasons for Refusal in Japanese Application No. 2020-103581 (Mar. 2024).

*Primary Examiner* — Eugene Lee
(74) *Attorney, Agent, or Firm* — Venable LLP

(57) ABSTRACT

Disclosed is a semiconductor device includes a substrate provided with a plurality of pixel electrodes and a control electrode, a functional layer provided over the plurality of pixel electrodes, a transparent electrode provided over the functional layer, an insulating layer provided so as to cover an upper surface and a side surface of a laminate including the functional layer and the transparent electrode and having a first opening reaching the transparent electrode, and a light-shielding conductive layer connected to the transparent electrode via the first opening and constituting at least a part of an electrical path connecting the transparent electrode and the control electrode.

23 Claims, 16 Drawing Sheets

(56) References Cited

U.S. PATENT DOCUMENTS

| | | | | |
|---|---|---|---|---|
| 2006/0196533 | A1* | 9/2006 | Maehara | H10K 39/32 |
| | | | | 136/243 |
| 2007/0045520 | A1* | 3/2007 | Mitsui | H01L 27/1462 |
| | | | | 250/214 R |
| 2011/0228150 | A1* | 9/2011 | Takata | H10K 39/32 |
| | | | | 257/E31.127 |
| 2012/0025179 | A1* | 2/2012 | Mitsui | B82Y 10/00 |
| | | | | 257/E51.026 |
| 2015/0091123 | A1* | 4/2015 | Chang | H01L 27/1463 |
| | | | | 257/448 |
| 2015/0188065 | A1* | 7/2015 | Takimoto | H01L 27/14685 |
| | | | | 257/40 |
| 2018/0109706 | A1* | 4/2018 | Matsuda | H01L 27/14629 |
| 2018/0350881 | A1* | 12/2018 | Nakayama | H01L 27/14 |
| 2019/0214427 | A1 | 7/2019 | Nozawa et al. | |
| 2021/0057168 | A1 | 2/2021 | Shiomi et al. | |
| 2021/0066360 | A1 | 3/2021 | Tomekawa et al. | |
| 2021/0074744 | A1 | 3/2021 | Sumida et al. | |
| 2021/0257399 | A1* | 8/2021 | Goden | H01L 27/14621 |
| 2021/0313378 | A1* | 10/2021 | Wakabayashi | H01L 27/14621 |
| 2023/0261024 | A1* | 8/2023 | Kim | H01L 27/14636 |
| | | | | 257/291 |

FOREIGN PATENT DOCUMENTS

| | | |
|---|---|---|
| JP | 2006-245045 A | 9/2006 |
| JP | 2015-12239 A | 1/2015 |
| JP | 2016-033978 A | 3/2016 |
| JP | 2019-121804 A | 7/2019 |
| WO | 2014/021177 A1 | 2/2014 |
| WO | 2018/110072 A1 | 6/2018 |
| WO | 2019/150989 A1 | 8/2019 |
| WO | 2019/239851 A | 12/2019 |

* cited by examiner

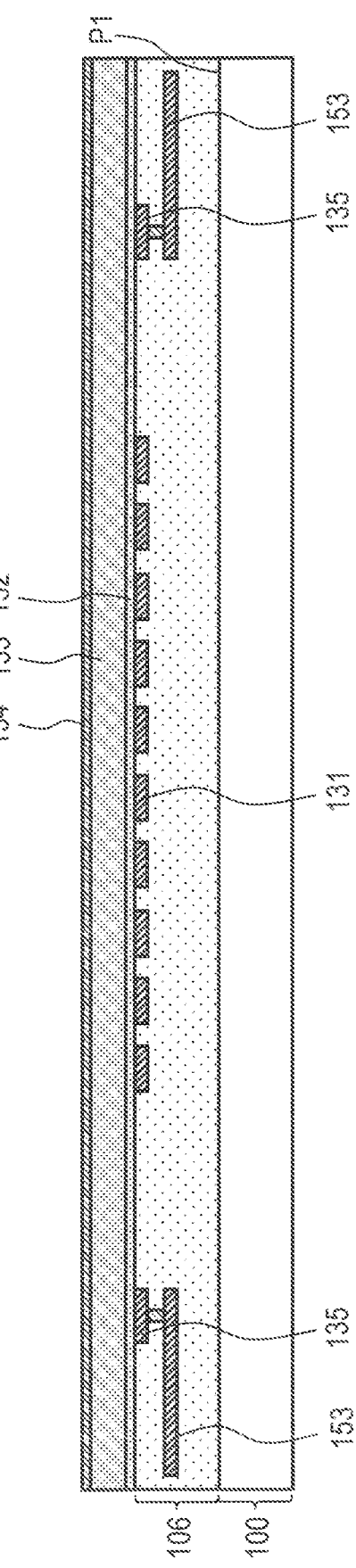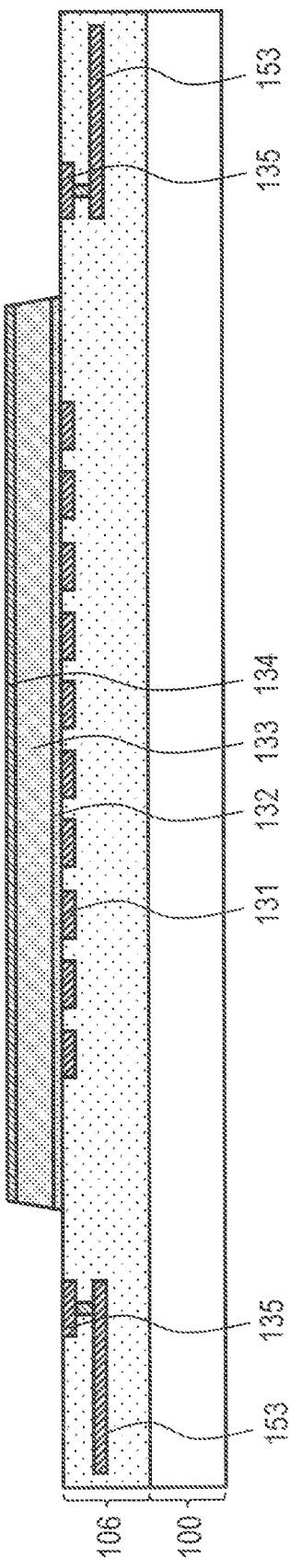

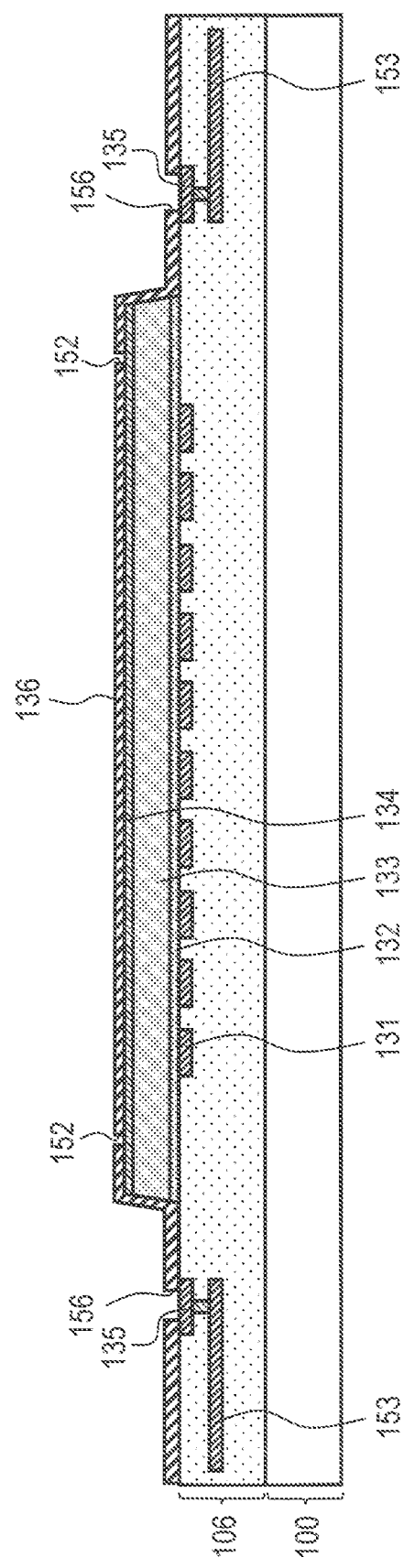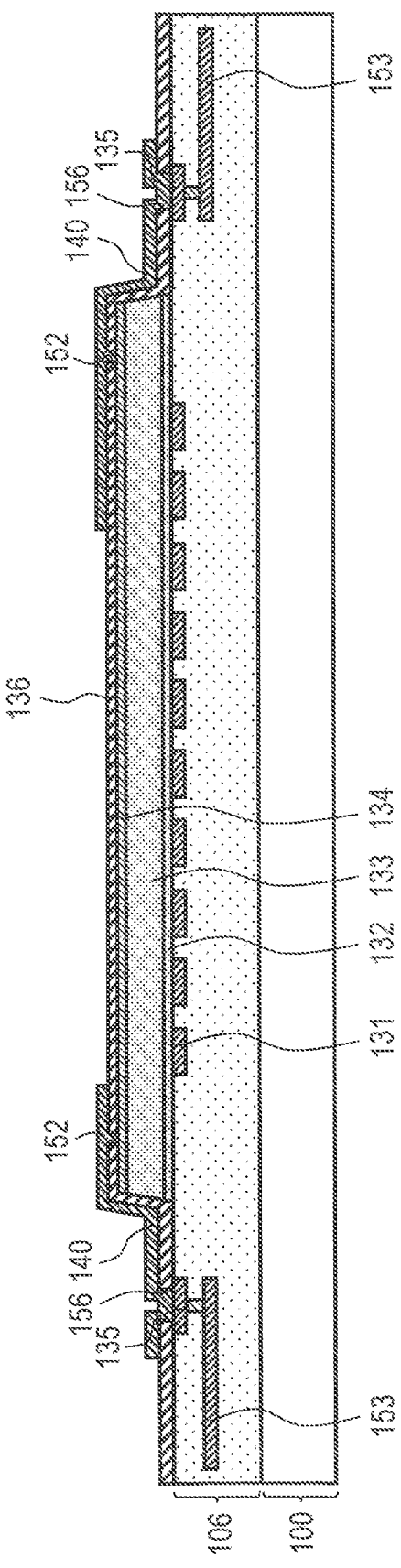

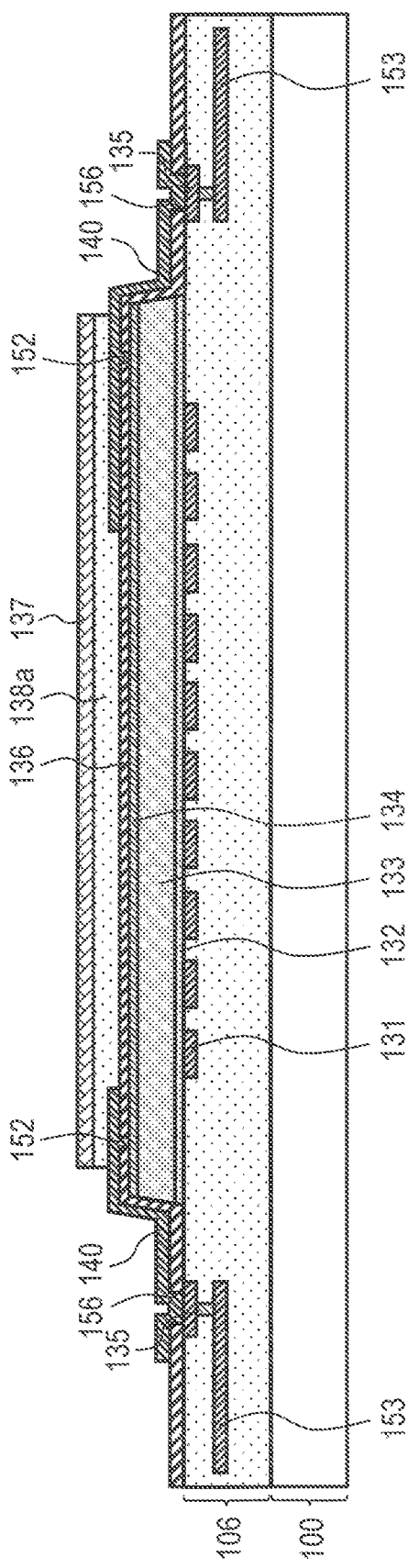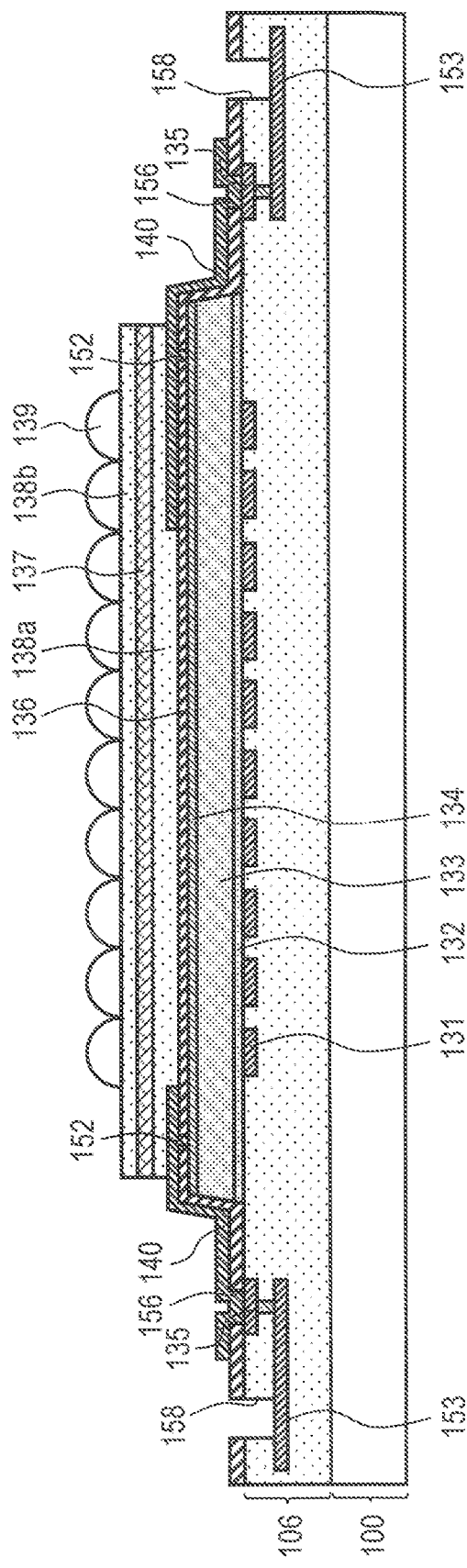

SEMICONDUCTOR DEVICE

BACKGROUND

Field

The present invention relates to a semiconductor device.

Description of the Related Art

Conventionally, a photodiode using a single crystalline silicon substrate has been widely used as a light detecting element constituting an imaging element. Japanese Patent Application Laid-Open No. 2019-121804 discloses a light detecting element using an organic material having high photosensitivity in a long wavelength region where sensitivity is low in silicon and a photoelectric conversion film containing quantum dots. These photoelectric conversion films are formed by a simple process such as vacuum deposition method or coating method. Therefore, by forming the photoelectric conversion film on the upper part of the substrate, that is, on the light incident side, it is possible to reduce the area per pixel and to realize an imaging device having high light utilization efficiency.

In the manufacturing process of the imaging device, after the photoelectric conversion film is formed, a thermal process at a temperature higher than that at the time of forming the photoelectric conversion film may be performed. For example, when a photoelectric conversion film is formed by a coating method, heat at a temperature higher than that at the time of forming the photoelectric conversion film may be applied in a step of forming a color filter or a microlens above the photoelectric conversion film or a step of mounting an imaging device. However, when heat higher than the temperature at the time of film formation is applied to the photoelectric conversion film formed by the coating method, desorption/decomposition and volatilization of ligands from the surface of the photoelectric conversion film may occur. As a result, the film may float or peel off from the substrate by moving the film. The floating or peeling of the photoelectric conversion film may lead to the deterioration of the characteristics of the light detecting element.

SUMMARY

An object of the present invention is to provide a technique for suppressing characteristic deterioration of functional elements constituting a semiconductor device.

According to one aspect of the present invention, there is provided a semiconductor device including a substrate provided with a plurality of pixel electrodes and a control electrode, a functional layer provided over the plurality of pixel electrodes, a transparent electrode provided over the functional layer, an insulating layer provided so as to cover an upper surface and a side surface of a laminate including the functional layer and the transparent electrode and having a first opening reaching the transparent electrode, and a light-shielding conductive layer electrically connected to the transparent electrode via the first opening and constituting at least a part of an electrical path connecting the transparent electrode and the control electrode.

According to another aspect of the present invention, there is provided a substrate provided with a plurality of pixel electrodes and a control electrode, a functional layer provided over the plurality of pixel electrodes, a transparent electrode provided over the functional layer, an insulating layer provided over the transparent electrode, and a light-shielding conductive layer provided so as to cover a part of an upper surface and a side surface of a laminate including the functional layer, the transparent electrode, and the insulating layer, wherein the light-shielding conductive layer has a first portion positioned on a side of the upper surface of the laminate and a second portion positioned on a side of the side surface of the laminate, wherein the transparent electrode is positioned between the first portion of the light-shielding conductive layer and the functional layer, wherein a distance A between the first portion of the light-shielding conductive layer and the transparent electrode and a distance B between the second portion of the light-shielding conductive layer and the functional layer are smaller than a distance C between the first portion of the light-shielding conductive layer and the functional layer, and wherein the transparent electrode and the control electrode are electrically connected via the light-shielding conductive layer.

Further features of the present invention will become apparent from the following description of exemplary embodiments with reference to the attached drawings.

BRIEF DESCRIPTION OF THE DRAWINGS

FIG. 7A, FIG. 7B, FIG. 7C, FIG. 7D, FIG. 7E, and FIG. 7F are cross-sectional views illustrating a method of manufacturing the semiconductor device according to the first embodiment of the present invention.

DESCRIPTION OF THE EMBODIMENTS

Preferred embodiments of the present invention will now be described in detail in accordance with the accompanying drawings.

First Embodiment

A semiconductor device according to a first embodiment of the present invention and a method of manufacturing the same will be described with reference to FIG. 1 to FIG. 7F. In the present embodiment, an imaging device will be described as an example of a semiconductor device to which the present invention may be applied. However, the semiconductor device to which the present invention may be applied is not limited to an imaging device, and may also be applied to, for example, a photoelectric conversion device not intended to acquire an image, a light emitting device, and the like.

Figure 1:
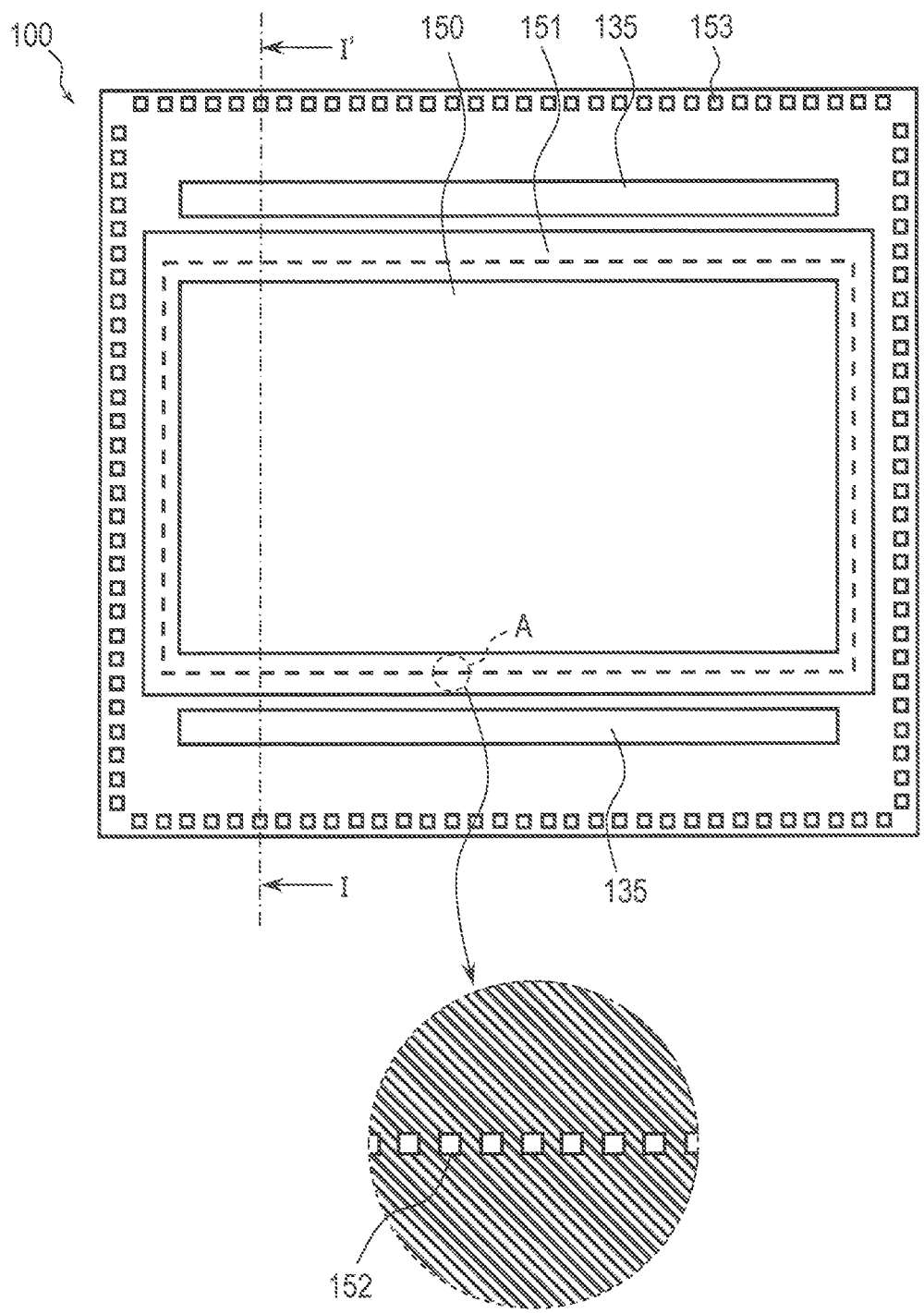
FIG. 1 is a plan view illustrating a schematic configuration of a semiconductor device according to a first embodiment of the present invention.
Figure 2:
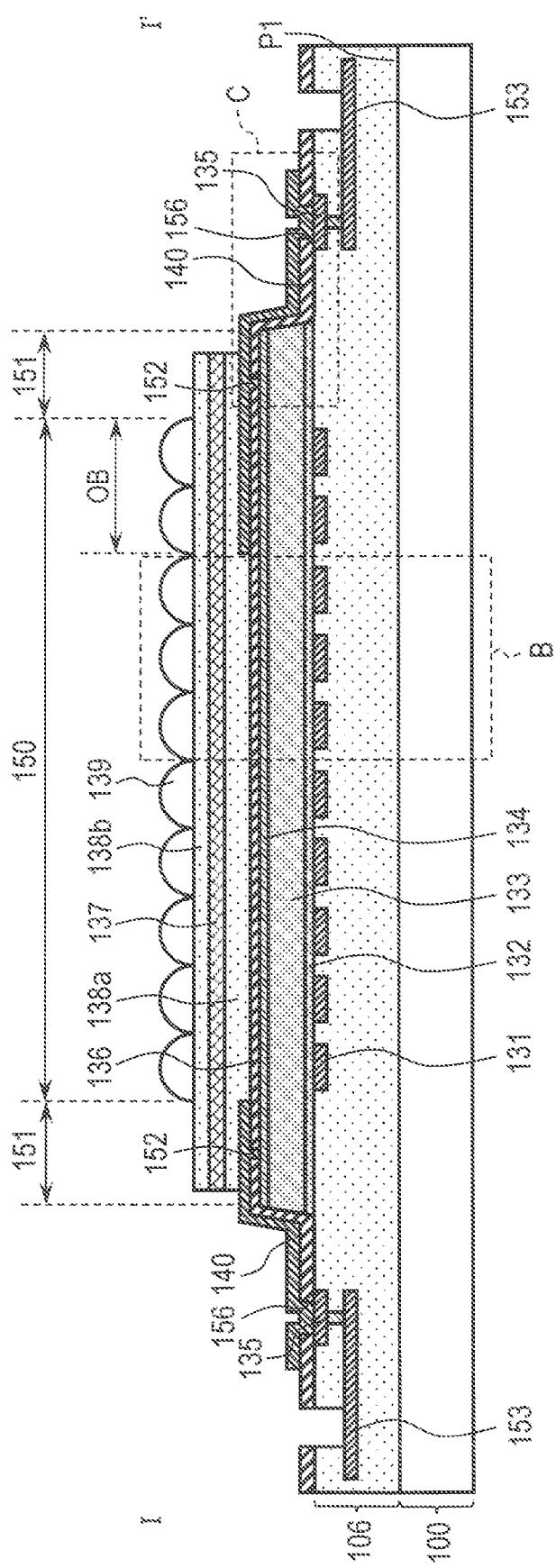
FIG. 2 is a schematic cross-sectional view of the semiconductor device according to the first embodiment of the present invention.
Figure 3:
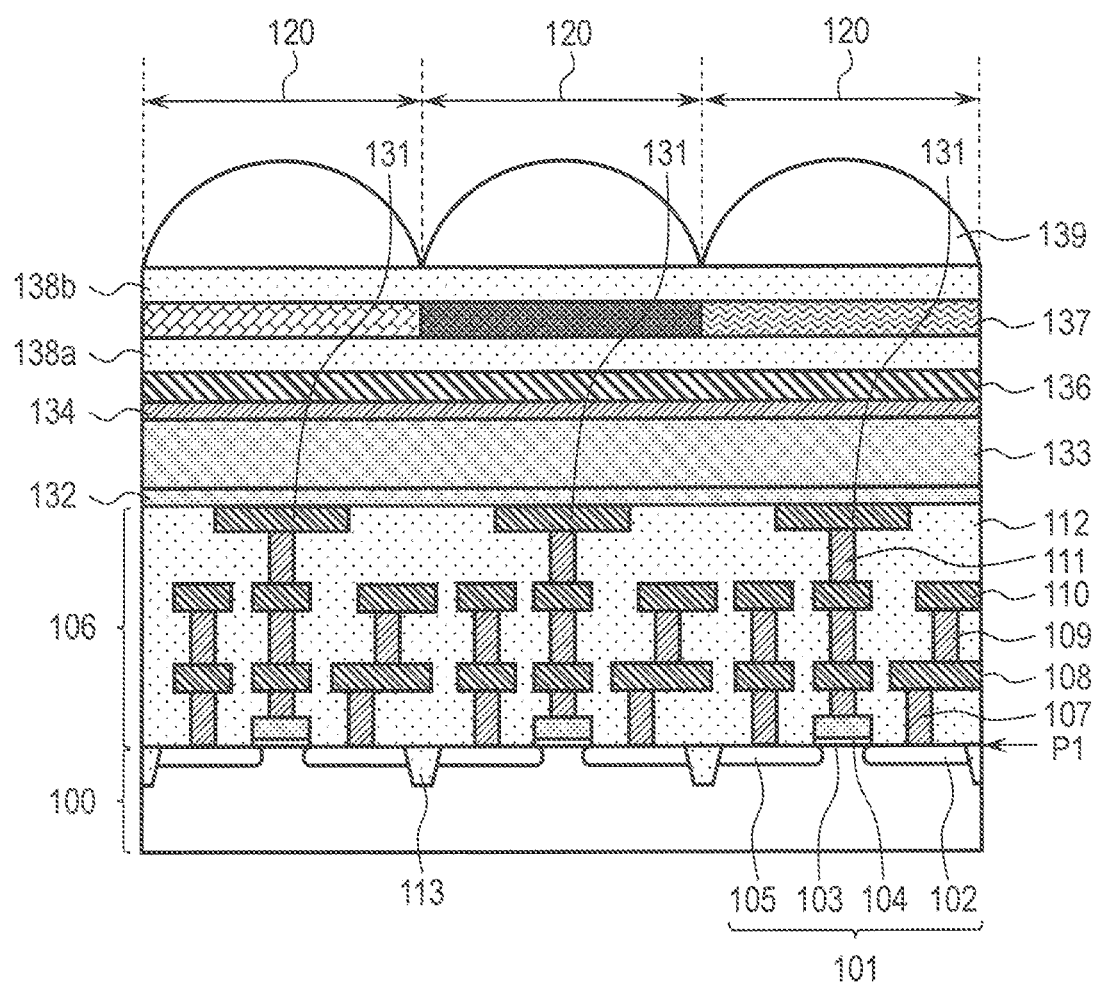
FIG. 3 is an enlarged cross-sectional view of a pixel region of the semiconductor device according to the first embodiment of the present invention.
Figure 4:
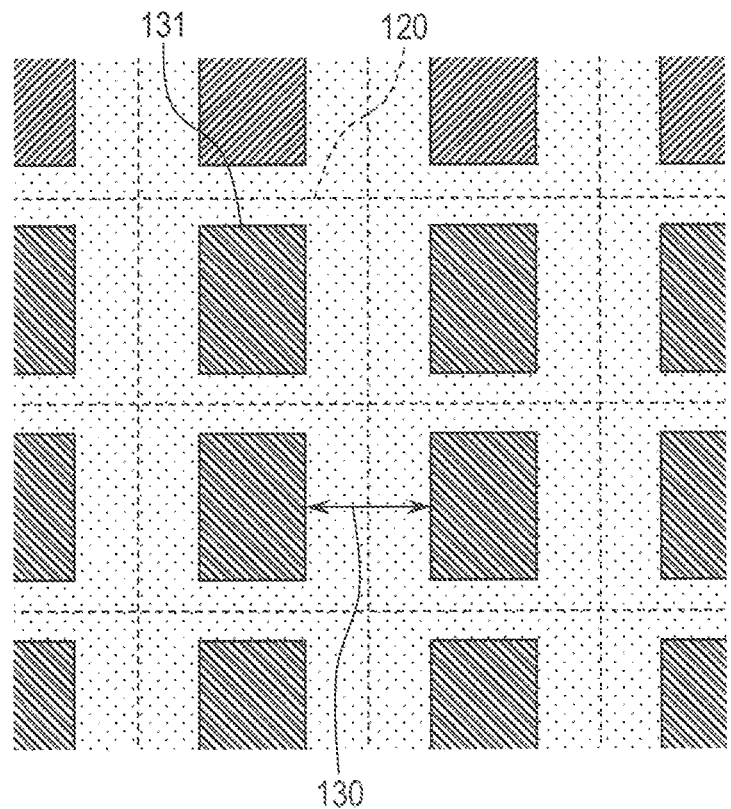
FIG. 4 is a plan view illustrating an arrangement of functional elements of the semiconductor device according to the first embodiment of the present invention.
Figure 5:
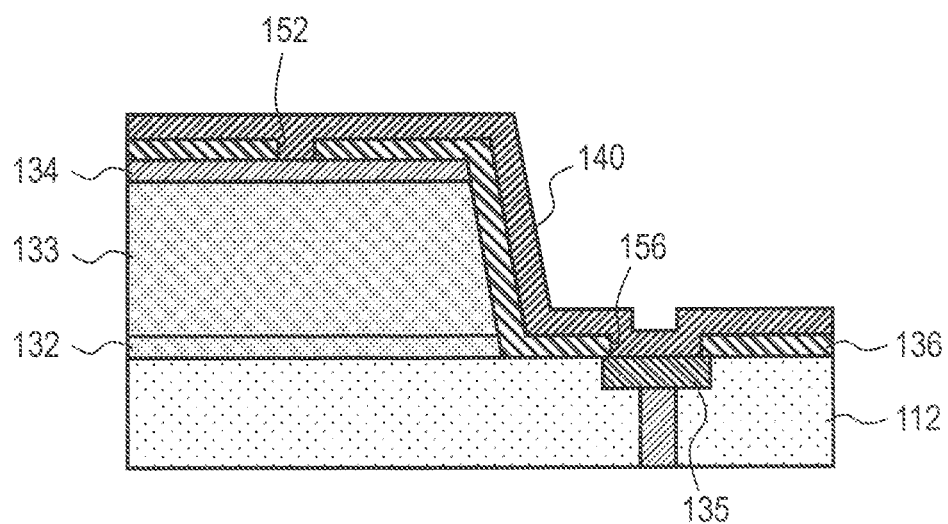
FIG. 5 is an enlarged cross-sectional view of a connection region of the semiconductor device according to the first embodiment of the present invention.
Figure 6:
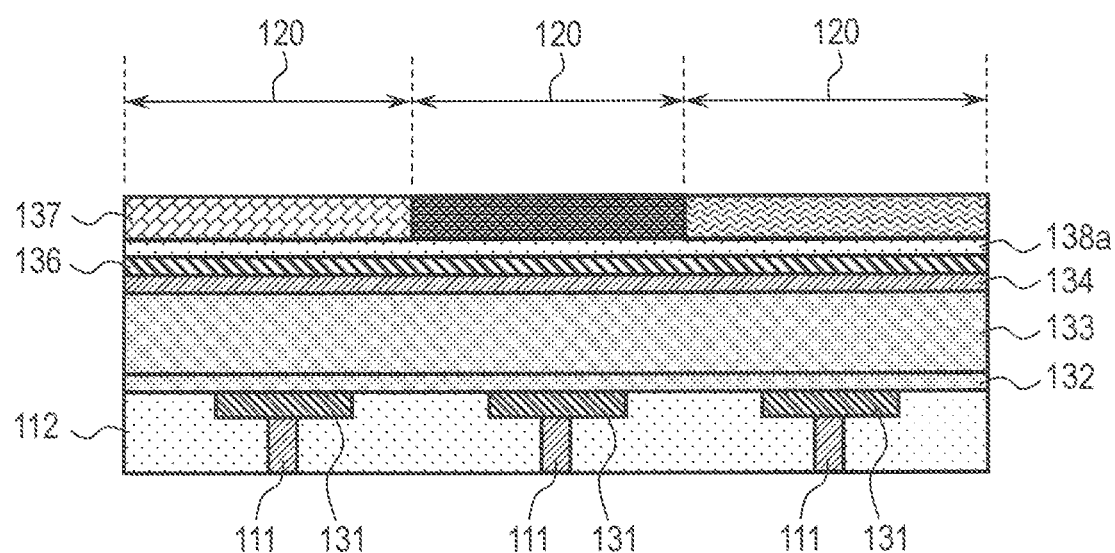
FIG. 6 is an enlarged cross-sectional view illustrating a configuration example of a functional element in the semiconductor device according to the first embodiment of the present invention.

First, the structure of the semiconductor device according to the present embodiment will be described with reference to FIG. 1 to FIG. 6. FIG. 1 is a plan view illustrating a schematic configuration of the semiconductor device according to the present embodiment. FIG. 2 is a schematic cross-sectional view taken along line I-I' in FIG. 1. FIG. 3 is a partial cross-sectional view of the region B in FIG. 2. FIG. 4 is a plan view illustrating the arrangement of the functional elements. FIG. 5 is a partial cross-sectional view of the region C in FIG. 2. FIG. 6 is a schematic cross-sectional view illustrating a specific structure of a functional element in the semiconductor device according to the present embodiment. The functional element in the semiconductor device of the present embodiment is a light detecting element (photoelectric conversion element).

The semiconductor device according to the present embodiment includes a substrate 100. In the present embodiment, a semiconductor substrate such as a single crystalline silicon substrate is assumed as the substrate 100. However, the substrate 100 is not necessarily a semiconductor substrate, and may be an insulating substrate such as a glass substrate or a ceramic substrate. The substrate 100 has a main surface P1.

As illustrated in FIG. 1, a pixel region 150 is provided at the center part of the main surface P1 of the substrate 100 in a plan view. In the pixel region 150, a plurality of unit cells (unillustrated) are arranged in a matrix. A connection region 151 is provided around the pixel region 150. A plurality of pad electrodes 153 is provided on the peripheral edge of the main surface P1 of the substrate 100. The pad electrodes 153 are electrodes for electrically connecting to a mounting substrate (not illustrated) by wire bonding or the like. Control electrodes 135 are provided between the connection regions 151 and the pad electrodes 153. The control electrodes 135 may be arranged to surround the pixel region 150 and the connection region 151.

As illustrated in FIG. 2, an interconnection structure 106 is provided on the main surface P1 of the substrate 100. In the interconnection structure 106, pixel electrodes 131 and the control electrodes 135 are constituted of an uppermost-level interconnection layer. In this specification, the substrate 100 and the interconnection structure 106 may be often collectively referred to as "substrate".

An intermediate layer 132, a functional layer 133, and a transparent electrode 134 (first) are provided over the interconnection structure 106 in the pixel region 150 and the connection region 151. Thus, light detecting elements each including the pixel electrode 131, the intermediate layer 132, the functional layer 133, and the transparent electrode 134 is formed. An insulating layer 136 (first) is provided over the entire surface of the interconnection structure 106 provided with the intermediate layer 132, the functional layer 133 and the transparent electrode 134. The insulating layer 136 is provided so as to cover the upper surface and the side surfaces of the laminate including the intermediate layer 132, the functional layer 133 and the transparent electrode 134.

An interconnection 140 for electrically connecting the transparent electrode 134 and the control electrode 135 is provided over the insulating layer 136. The interconnection 140 is connected to the transparent electrode 134 through an opening 152 provided in the insulating layer 136, and is connected to the control electrode 135 through an opening 156 provided in the insulating layer 136. On the insulating layer 136 above the transparent electrode 134, an optical structure including a planarization layer 138a, a color filter layer 137, a planarization layer 138b, and a microlens layer 139 is provided.

Next, the structure of each part will be described in more detail.

As illustrated in FIG. 3, a transistor 101 and an element isolation portion 113 are provided near the main surface P1 of the substrate 100. The transistor 101 is, for example, an n-channel MOS transistor and includes n-type semiconductor regions 102, 105 constituting a source/drain regions, a gate insulating film 103, and a gate electrode 104. The n-type semiconductor regions 102, 105 are provided inside the substrate 100. The gate electrode 104 is provided over the main surface P1 between the n-type semiconductor region 102 and the n-type semiconductor region 105 with the gate insulating film 103 interposed therebetween. The element isolation portion 113 is an insulating structure provided inside the substrate 100, and is formed of, for example, an STI (Shallow Trench Isolation) structure.

The interconnection structure 106 is provided over the main surface P1 of the substrate 100. The interconnection structure 106 has a plurality of interconnection layers arranged in the insulating layer 112. FIG. 3 illustrates a multilevel interconnection structure including three interconnection layers of a first interconnection layer including an interconnection layer 108, a second interconnection layer including an interconnection layer 110, and a third interconnection layer including the pixel electrodes 131 and the control electrodes 135. However, the multilevel interconnection structure constituting the interconnection structure 106 does not necessarily have to have three layers, but may have two or less layers or four or more layers. The interconnection structure 106 includes contact plugs 107 for connecting the transistor 101 and the interconnection layer 108, via plugs 109 for connecting the interconnection layer 108 and the interconnection layer 110, and via plugs 111 for connecting the interconnection layer 110 and the pixel electrodes 131.

The plurality of unit cells 120 are arranged in a matrix over a plurality of rows and a plurality of columns, for example, as illustrated in FIG. 4. The pixel electrode 131 is provided corresponding to each of a plurality of unit cells 120 constituting the pixel region 150. The plurality of pixel electrodes 131 are provided apart from each other, and a region between the adjacent pixel electrodes 131 constitute an isolation region 130. The isolation region 130 may be composed of an insulating layer 112. Each of the plurality of pixel electrodes 131 is connected to a corresponding via plug 111. As illustrated in FIG. 1 and FIG. 2, the control electrodes 135 are provided outside the pixel region 150.

The pixel electrodes 131, the control electrodes 135, and the isolation region 130 form a substantially flat surface on the side opposite to the substrate 100. As illustrated in FIG. 3, the intermediate layer 132 is continuously provided over a substantially flat surface formed by an upper portion of the pixel electrodes 131 and an upper portion of the isolation region 130.

These members constituting the interconnection structure 106 may be formed using materials and manufacturing processes generally used in semiconductor devices. For example, contact plugs 107 and via plugs 109, 111 may be made of one or more conductive materials selected from aluminum, copper, tungsten, titanium, and titanium nitride. Typically, the contact plugs 107 and the via plugs 109, 111 may be layered structures of titanium, titanium nitride, and tungsten. The interconnection layers 108, 110 may be made of one or more conductive materials selected from aluminum, copper, tungsten, titanium, titanium nitride, tantalum, and the like. Typically, interconnection layers 108, 110 may be a layered structure of tantalum and copper. The plurality of pixel electrodes 131 may be made of, for example, a conductive material such as copper or aluminum. The insulating layer 112 may be made of an insulating material selected from, for example, silicon oxide, silicon nitride, aluminum oxide, and the like. Although not illustrated in detail in FIG. 2 and FIG. 3, the insulating layer 112 is generally composed of a multilayer film made of a plurality of kinds of insulating materials.

Over the interconnection structure 106, an intermediate layer 132, a functional layer 133, and a transparent electrode 134 are provided in this order. The pixel electrode 131 is an individual electrode provided for each unit cell 120, and the transparent electrode 134 is a common electrode provided commonly for the plurality of unit cells 120. In the present embodiment, the upper and lower surfaces of the transparent electrode 134 are flat.

In the present embodiment, the functional layer 133 is a photoelectric conversion film and has a function of photodetection. In this case, the intermediate layer 132, the functional layer 133, and the transparent electrode 134 together with the pixel electrode 131 constitute a light detecting element of each unit cell 120. The pixel electrode 131 may be used to read out signals based on charge generated by photoelectric conversion in the functional layer 133. When the semiconductor device is a light emitting device, the functional layer 133 has a light emitting function. In this case, the pixel electrode 131 may be used to supply control signals for controlling light emission or non-light emission and controlling light emission intensity to the functional layer.

The intermediate layer 132 is arranged between each of the plurality of pixel electrodes 131 and the functional layer 133. The intermediate layer 132 is a layer that secures electrical insulation between each of the plurality of pixel electrodes 131 and the functional layer 133 with respect to one carrier of holes and electrons, and secures conduction with respect to the other carrier. Therefore, the intermediate layer 132 may also be called a carrier injection blocking layer. The intermediate layer 132 may be a layer (electron blocking layer) that blocks electrons and conducts holes when the plurality of pixel electrodes 131 are electrodes that collect holes (cathode). When the plurality of pixel electrodes 131 are electrodes for collecting electrons (anode), the intermediate layer 132 may be a layer (hole blocking layer) for blocking holes and conducting electrons.

When the intermediate layer 132 is an electron blocking layer, a hole blocking layer (not illustrated) may be provided between the functional layer 133 and the transparent electrode 134. On the other hand, when the intermediate layer 132 is a hole blocking layer, an electron blocking layer (not illustrated) may be provided between the functional layer 133 and the transparent electrode 134.

The intermediate layer 132 may also function as an adhesion layer for improving adhesion between each of the plurality of pixel electrodes 131 and the functional layer 133. By disposing the intermediate layer 132 between the pixel electrode 131 and the functional layer 133, film peeling due to poor wettability between the pixel electrodes 131 and the functional layer 133 may be reduced. The intermediate layer 132 is preferably provided over the entire surface under the functional layer 133. With this structure, the contact area between the intermediate layer 132 and the functional layer 133 may be increased, and the film peeling reduction effect may be further improved.

As illustrated in FIG. 2, the intermediate layer 132, the functional layer 133 and the transparent electrode 134 have a mesa shape and are selectively provided in the pixel region 150 and the connection region 151. The control electrode 135 is not covered by the intermediate layer 132, the functional layer 133 and the transparent electrode 134.

An insulating layer 136 is provided over the entire surface of the interconnection structure 106 including the upper surface of the transparent electrode 134. The insulating layer 136 may also function as a sealing film (passivation film). As illustrated in FIG. 5, the insulating layer 136 is provided with an opening 152 reaching the upper surface of the transparent electrode 134 and an opening 156 reaching the control electrode 135. The opening 152 is provided at the peripheral edge of the pixel region 150 where the unit cell 120 is not provided. As illustrated in an enlarged view of the region A in FIG. 1, a plurality of openings 152 are arranged in the connection region 151 so as to surround a region in which a plurality of unit cells 120 are arranged.

An interconnection 140 is provided over the insulating layer 136. As illustrated in FIG. 2 and FIG. 5, the interconnection 140 is connected to the transparent electrode 134 through the opening 152, and is connected to the control electrode 135 through the opening 156. Thus, the control electrode 135 and the transparent electrode 134 are electrically connected via the interconnection 140. Note that the interconnection 140 does not necessarily have to be directly connected to the control electrode 135 and the transparent electrode 134, but may constitute at least a part of an electrical path connecting the control electrode 135 and the transparent electrode 134.

The interconnection 140 may be made of a material having conductivity, for example, a metal material such as aluminum or gold, an alloy material such as an aluminum-copper alloy, a metal oxide material such as indium oxide or tin oxide, or a composite oxide material (e.g. ITO or IZO) containing them.

As illustrated in FIG. 2, the interconnection 140 may extend between the insulating layer 136 and the planarization layer 138a of some unit cells 120. If the interconnection 140 is made of a light-shielding material such as a metal material such as aluminum or gold, or an alloy material such as an aluminum-copper alloy, the interconnection 140 may also serve as a light-shielding layer (light-shielding conductive layer) for blocking incident light to the functional layer 133. In this case, the unit cell 120 in which the interconnection 140 extends between the insulating layer 136 and the planarization layer 138a may be used as a pixel (Optical Black Pixel OB) for generating a reference signal.

Over the insulating layer 136 in the region where the intermediate layer 132, the functional layer 133 and the transparent electrode 134 are provided, a planarization layer 138a, a color filter layer 137, a planarization layer 138b, and a microlens layer 139 are provided in this order. The planarization layer 138a, the color filter layer 137, the planarization layer 138b and the microlens layer 139 constitute an optical structure which optically acts on light incident on the functional layer 133.

As illustrated in FIG. 6, the color filter layer 137 has a plurality of color filters arranged in a predetermined pattern so that a color filter of a predetermined color is arranged in each of the plurality of unit cells 120. The planarization layer 138a forms a flat upper surface suitable for forming the color filter layer 137 over the insulating layer 136 and the interconnection 140. The planarization layer 138b forms a flat upper surface suitable for forming the microlens layer 139 over the color filter layer 137. The microlens layer 139 has a plurality of microlenses corresponding to each of the plurality of unit cells 120. One unit cell 120 includes one microlens. One unit cell 120 may include a plurality of light detecting elements corresponding to one microlens, i.e., a plurality of pixel electrodes 131.

Next, the functional layer 133 applicable to the semiconductor device of the present embodiment will be described in more detail. In the present embodiment, an example in which a colloidal quantum dot film which is an aggregate of nanoparticles such as a compound semiconductor functioning as a photoelectric conversion layer is used to constitute the functional layer 133 will be described. However, the functional layer 133 may function as a photoelectric conversion layer, and the material and manufacturing method thereof are not particularly limited.

The colloidal quantum dot includes nanoparticles having an average particle size of not less than 0.5 nm and less than 100 nm. As the material of the nanoparticles, a single element semiconductor (group IV semiconductor) or a compound semiconductor may be used. The compound semiconductor may be a III-V semiconductor, a II-VI semiconductor, or a semiconductor composed of a combination of three or more elements of groups II, III, IV, V, and VI. Specifically, semiconductor materials such as PbS, PbSe, PbTe, InN, InAs, InP, InSb, InGaAs, CdS, CdSe, CdTe, Ge, CuInS, CuInSe, CuInGaSe, and Si may be mentioned. These materials are semiconductor materials having a relatively narrow energy band gap. The colloidal quantum dots may comprise only one type of nanoparticle of the materials described above or may comprise more than one type of nanoparticle. Colloidal quantum dots containing these materials are also referred to as semiconductor quantum dots. The nanoparticle structure may be a core-shell structure comprising a nucleus (core) comprising the semiconductor described above and a coating material covering the nucleus.

The size of the nanoparticles may be set to be not more than the exciton Bohr radius inherent in each semiconductor material. In this case, a desired energy band gap corresponding to the size is obtained by developing the quantum size effect. That is, the light absorption wavelength or the light emission wavelength may be controlled by controlling the size of the nanoparticles to a predetermined value.

The material used for the nanoparticles is preferably PbS or PbSe from the viewpoint of ease of synthesis. Since the exciton Bohr radius of PbS is approximately 18 nm, the average particle size of the nanoparticles is preferably in the range of 2 nm to 15 nm from the viewpoint of controlling crystal growth and developing quantum size effects. By setting the average particle size of the nanoparticles to 2 nm or more, crystal growth may be easily controlled in the synthesis of the nanoparticles. A transmission electron microscope may be used to measure the particle size of the nanoparticles.

The thickness of the functional layer 133 is not particularly limited, but is preferably not less than 10 nm, and more preferably not less than 50 nm, from the viewpoint of obtaining high optical absorption characteristics. From the viewpoint of ease of manufacture, the thickness of the functional layer 133 is preferably not more than 800 nm.

Next, the intermediate layer 132 applicable to the semiconductor device of the present embodiment will be described in more detail. As described above, the intermediate layer 132 may be an electron blocking layer or a hole blocking layer depending on the type of carriers collected by the pixel electrode 131. The intermediate layer 132 may also function as an adhesion layer for suppressing film peeling of the functional layer 133.

First, a case where the intermediate layer 132 is an electron blocking layer will be described. The material of the electron blocking layer is preferably one that can efficiently transport holes generated in the functional layer 133 serving as the photoelectric conversion layer to the cathode. The material preferably has such properties as high hole mobility, high electrical conductivity, a small hole injection barrier between the material and the cathode, and a small hole injection barrier from the functional layer 133 to the electron blocking layer. Furthermore, when light is taken into the functional layer 133 via the electron blocking layer, a material having high transparency is preferably used as the material of the electron blocking layer. The transmittance of visible light in the transparent electron blocking layer is preferably not less than 60%, more preferably not less than 80%. From this viewpoint, specific examples of materials for the electron blocking layer include p-type inorganic semiconductors such as molybdenum oxide ($MoO_3$) and nickel oxide (NiO), and p-type organic semiconductors such as PEDOT: PSS.

Next, a case where the intermediate layer 132 is a hole blocking layer will be described. The function required of the hole blocking layer is to block holes generated in the functional layer 133, which is a photoelectric conversion layer, and to transport electrons to the anode, as opposed to the electron blocking layer. Therefore, in the above description of the electron blocking layer, the cathode is replaced with an anode, and the p-type semiconductor is replaced with an n-type semiconductor, which is a preferable property in the hole blocking layer. When light is irradiated from the anode side or when light reflected from the anode side is utilized, a material having high transparency is preferably used as the material of the hole blocking layer. From this viewpoint, specific examples of the material of the hole blocking layer include an n-type wide-gap semiconductor such as titanium oxide ($TiO_2$) and zinc oxide (ZnO), and an n-type semiconductor such as fullerene ($C_{60}$). In particular, an oxide-based inorganic semiconductor is preferable in the step of applying a quantum dot dispersion because of its low solubility in the dispersion.

The thickness of the intermediate layer 132 is not particularly limited, but is, for example, about 1 nm to 100 nm.

When the thickness of the intermediate layer 132 is small, the voltage applied to the functional layer 133 may be reduced. On the other hand, when the intermediate layer 132 is thick, the possibility of electrons or holes passing through the intermediate layer 132 may be reduced by the tunneling effect. When the thickness of the intermediate layer 132 is large, the occurrence of film defects due to pinholes or the like may be reduced. For example, when the film thickness of the intermediate layer 132 is thicker than the unevenness of the surface of the pixel electrode 131, film defects may be reduced. In consideration of these viewpoints, the film thickness of the intermediate layer 132 may be appropriately set.

Next, the pixel electrode 131 and the transparent electrode 134 applicable to the semiconductor device of the present embodiment will be described in more detail.

The pixel electrode 131 and the transparent electrode 134 may be formed of any conductive material. Specific examples of the material of the pixel electrode 131 include metals such as platinum, gold, silver, aluminum, chromium, nickel, copper, titanium, magnesium, and alloys containing these metals. The material of the transparent electrode 134 may be a metal oxide such as indium oxide or tin oxide, or a composite oxide containing the metal oxides (e.g. ITO or IZO). The materials of the pixel electrode 131 and the transparent electrode 134 may be one of a plurality of exemplified materials used alone, or two or more materials used in a predetermined combination or ratio.

The pixel electrode 131 and the transparent electrode 134 have a function of collecting electrons or holes generated in the functional layer 133. Therefore, it is more preferable to use a material suitable for collecting electrons or holes as the material of the pixel electrode 131 and the transparent electrode 134. Examples of electrode materials suitable for hole collection include materials having a large work function, such as gold, ITO, and the like. Examples of materials suitable for electron collection include materials having a small work function, such as aluminum.

Next, a method of manufacturing a semiconductor device according to the present embodiment will be described with reference to FIG. 7A to FIG. 7F. FIG. 7A to FIG. 7F are cross-sectional views illustrating a method of manufacturing a semiconductor device according to the present embodiment.

First, a predetermined element such as a transistor and an element isolation portion (not illustrated) is formed on the main surface P1 of the substrate 100, which is, for example, a silicon substrate, using a general semiconductor process.

Next, over the main surface P1 of the substrate 100, an interconnection structure 106 comprised of a plurality of interconnection layers provided in the insulating layer 112 and including pixel electrodes 131 and control electrodes 135 is formed by using a general semiconductor process. In this case, the planarization process is performed so that the heights of the upper surfaces of the insulating layer 112, the pixel electrodes 131 and the control electrodes 135 coincide with each other.

Next, titanium oxide is deposited on the planarized interconnection structure 106 by, for example, sputtering method to form an intermediate layer 132 made of titanium oxide.

Next, a plurality of PbS quantum dot dispersions prepared in advance are coated over the intermediate layer 132 by, for example, a spin coating method. Subsequently, a ligand solution containing an organic ligand benzenedithiol (1,4-BDT) having a short molecular chain length is applied in the same manner. Thereafter, the coating film is left in a glove box in a nitrogen atmosphere (oxygen concentration of not more than 1 ppm, moisture concentration of not more than 1 ppm) and dried to form a functional layer 133. The temperature at which the functional layer 133 is formed is, for example, about 120° C.

Next, molybdenum oxide is deposited over the functional layer 133 by, for example, evaporation method to form an electron blocking layer (not illustrated) made of molybdenum oxide.

Next, indium tin oxide (ITO) is deposited over the electron blocking layer by, for example, sputtering method to form a transparent electrode 134 made of ITO (FIG. 7A).

Next, silicon nitride is deposited over the transparent electrode 134 by, for example, plasma CVD method to form a protective film (not illustrated) made of silicon nitride.

Then, the intermediate layer 132, the functional layer 133, the electron blocking layer, the transparent electrode 134 and the protective film are patterned by photolithography and dry etching. Thus, the intermediate layer 132, the functional layer 133, the electron blocking layer, the transparent electrode 134, and the protective film in the region excluding the pixel region 150 and the connection region 151 are removed. Thus, the control electrode 135 is exposed around the connection region 151 (FIG. 7B).

Next, over the entire surface, for example, silicon nitride is deposited by plasma CVD method to form an insulating layer 136 made of silicon nitride.

Next, the insulating layer 136 is patterned by photolithography and dry etching. Thus, openings 152 for exposing the transparent electrode 134 in the connection region 151 and openings 156 for exposing the control electrodes 135 are formed in the insulating layer 136 (FIG. 7C).

Then, Ti and AlCu are sequentially deposited over the insulating layer 136 provided with the openings 152, 156 by sputtering method, for example, to form a conductive film having an AlCu/Ti structure.

Then, the conductive film is patterned by photolithography and dry etching to form the interconnection 140 of the AlCu/Ti structure (FIG. 7D). The interconnection 140 is connected to the transparent electrode 134 through the openings 152, and is connected to the control electrodes 135 through the openings 156.

Next, a planarization layer 138a and a color filter layer 137 having a predetermined color arrangement are sequentially formed over the insulating layer 136 and the interconnection 140 (FIG. 7E).

Then, a planarization layer 138b and a microlens layer 139 are sequentially formed over the color filter layer 137. The temperature at which the color filter layer 137 and the microlens layer 139 are formed is, for example, about 180° C.

Next, using photolithography and dry etching, the insulating layer 136 and the insulating layer 112 are patterned to form openings 158 for exposing the pad electrodes 153 (FIG. 7F). Thus, the semiconductor device according to the present embodiment is completed.

In order for the semiconductor device according to the present embodiment to function as a photoelectric conversion device, it is necessary to arrange an optical structure including the color filter layer 137 and the microlens layer 139 above the functional layer 133. Here, when the color filter layer 137 and the microlens layer 139 are formed, as described above, heat at a higher temperature than when the functional layer 133 is formed may be applied.

However, when the functional layer 133 formed by the coating method is exposed to a temperature higher than that at the time of formation, desorption decomposition and volatilization of ligands from the surface of the functional layer 133 may occur. As a result, the functional layer 133 may move, and deformation such as film floating from the base or film peeling may occur. The film floating or peeling of the functional layer 133 may lead to the deterioration of the characteristics of the light detecting element.

By providing the insulating layer 136 so as to cover the functional layer 133 and the transparent electrode 134, it is possible to suppress movement of the functional layer 133 when exposed to a temperature higher than that at the time of forming the functional layer 133, and to suppress deformation of the functional layer 133 such as film floating and film peeling.

However, in order for the functional layer 133 to function as a photoelectric conversion film, it is necessary to electrically connect the transparent electrode 134 and the control electrode 135 provided over the functional layer 133. For this purpose, the openings 152 for electrically connecting the transparent electrode 134 and the control electrodes 135 are provided in the insulating layer 136, but the effect of suppressing deformation of the functional layer 133 may be impaired by providing the openings 152 in the insulating layer 136. For example, when large-sized openings 152 are provided in the connection region 151 so as to surround the pixel region 150, the functional layer 133 is exposed to a temperature higher than that at the time of formation, and the functional layer 133 under the opening 152 may be deformed by the heat.

From this viewpoint, in the present embodiment, by optimizing the shape and arrangement of the openings 152 provided in the insulating layer 136, deformation of the functional layer 133 due to heat applied after formation of the functional layer 133 is suppressed.

Although it is difficult to uniformly determine the shape of the openings 152 necessary for suppressing the deformation of the functional layer 133 because it varies depending on the constituent materials and the forming conditions of the functional layer 133, the forming conditions of the optical structure, and the like, it may be determined as one index based on the experience of the inventors or the like as follows.

That is, the size of the openings 152 in plan view is set to a size that may suppress deformation of the functional layer 133 when heat is applied to the functional layer 133, specifically, a maximum width (length or diameter of long side) is set to not more than 250 µm. In order to further enhance heat resistance, it is more preferable to set the maximum width (length or diameter of long side) of the openings 152 to not more than 30 µm.

When the inventors examined the above manufacturing conditions, it was found that when the rectangular opening 152 having a short side of 10 µm and a long side of 300 µm was arranged, deformation occurred in the functional layer 133 under the opening 152. On the other hand, when the square shaped openings 152 each having a side of 10 µm are arranged so as to surround the pixel region 150 at a pitch of 20 µm, the functional layer 133 under the openings 152 is not deformed.

Further, it is desirable that the total area of the plurality of openings 152 in a plan view is not more than 10% of the area of the pixel region 150 in a plan view. In order to further enhance heat resistance, it is more preferable to set the total area of the openings 152 in a plan view to not more than 6% of the area of the pixel region 150 in a plan view. The smaller the ratio of the total area of the plurality of openings 152 to the area of the pixel region 150, the higher the heat resistance can be. In the present embodiment, the pixel region 150 has a short side of 5700 µm and a long side of 10,000 µm, and the total area of the plurality of openings 152 is about 0.6% of the area of the pixel region 150.

In the present embodiment, although silicon nitride is applied as the insulating layer 136, the insulating layer 136 is not limited to silicon nitride, and may be made of silicon oxide, aluminum oxide, or the like.

In the present embodiment, the openings 152 are arranged at a pitch of 20 µm, but the pitch of the openings 152 is not limited to this. The openings 152 are not necessarily arranged at equal intervals, but may be arranged irregularly.

Further, in the present embodiment, the shape of the opening 152 in a plan view is a square shape having one side 10 µm, but the shape of the opening 152 is not limited to this. For example, the shape of the opening 152 in a plan view may be a point symmetrical figure such as a circle, an ellipse, a rectangle, a diamond, a polygon, or the like.

As described above, according to the present embodiment, it is possible to suppress the characteristic deterioration of the functional element constituting the semiconductor device.

Second Embodiment

Figure 8:
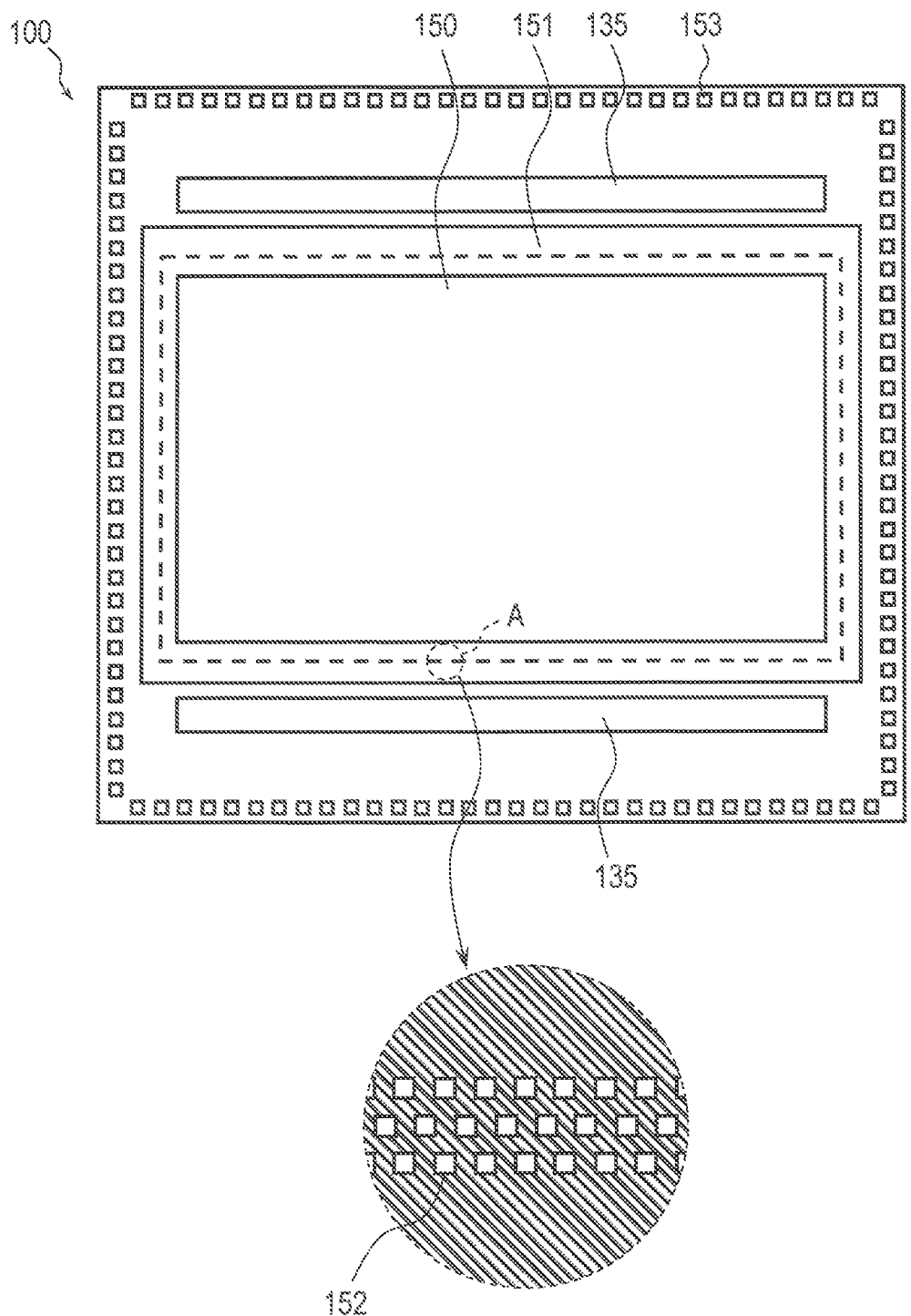
FIG. 8 is a plan view illustrating a schematic configuration of a semiconductor device according to a second embodiment of the present invention.

A semiconductor device according to a second embodiment of the present invention will be described with reference to FIG. 8. Components similar to those of the semiconductor device according to the first embodiment are denoted by the same reference numerals, and descriptions thereof are omitted or simplified. FIG. 8 is a plan view illustrating the structure of the semiconductor device according to the present embodiment.

The semiconductor device according to the present embodiment is the same as the semiconductor device according to the first embodiment except that the planar layout of the openings 152 is different. In the first embodiment, the square shaped openings 152 each having a side of 10 µm is arranged so as to surround the pixel region 150 at a pitch of 20 µm. On the other hand, in the present embodiment, the square shaped openings 152 each having a side of 10 µm are triply arranged so as to surround the pixel region 150 at a pitch of 20 µm.

The multiple arrangement of the openings 152 surrounding the pixel region 150 increases the contact area between the transparent electrode 134 and the interconnection 140 and reduces the connection resistance between the transparent electrode 134 and the interconnection 140. As a result, the transparent electrode 134 and the control electrode 135 may be connected to each other with low resistance, so that the increased speed and the reduced power consumption of the semiconductor device may be achieved.

Also in the present embodiment, the size of the openings 152 in plan view is set to a size that may suppress deformation of the functional layer 133 when heat is applied to the functional layer 133, specifically, the length or diameter of one side is set to not more than 250 µm. In order to further enhance the heat resistance, the length or diameter of the long side of the opening 152 is preferably set to not more than 30 µm.

Further, it is desirable that the total area of the plurality of openings 152 in a plan view is not more than 10% of the area of the pixel region 150 in a plan view. In order to further enhance heat resistance, it is more preferable to set the total area of the openings 152 in a plan view to not more than 6% of the area of the pixel region 150 in a plan view. The smaller the ratio of the total area of the plurality of openings 152 to the area of the pixel region 150, the higher the heat resistance can be. In the present embodiment, the pixel region 150 has a short side of 5700 μm and a long side of 10,000 μm, and the total area of the plurality of openings 152 is about 1.8% of the area of the pixel region 150.

The size, pitch, and two-dimensional arrangement of the openings 152 may be appropriately set within a range satisfying these conditions.

As described above, according to the present embodiment, it is possible to suppress the characteristic deterioration of the functional element constituting the semiconductor device.

Third Embodiment

Figure 9:
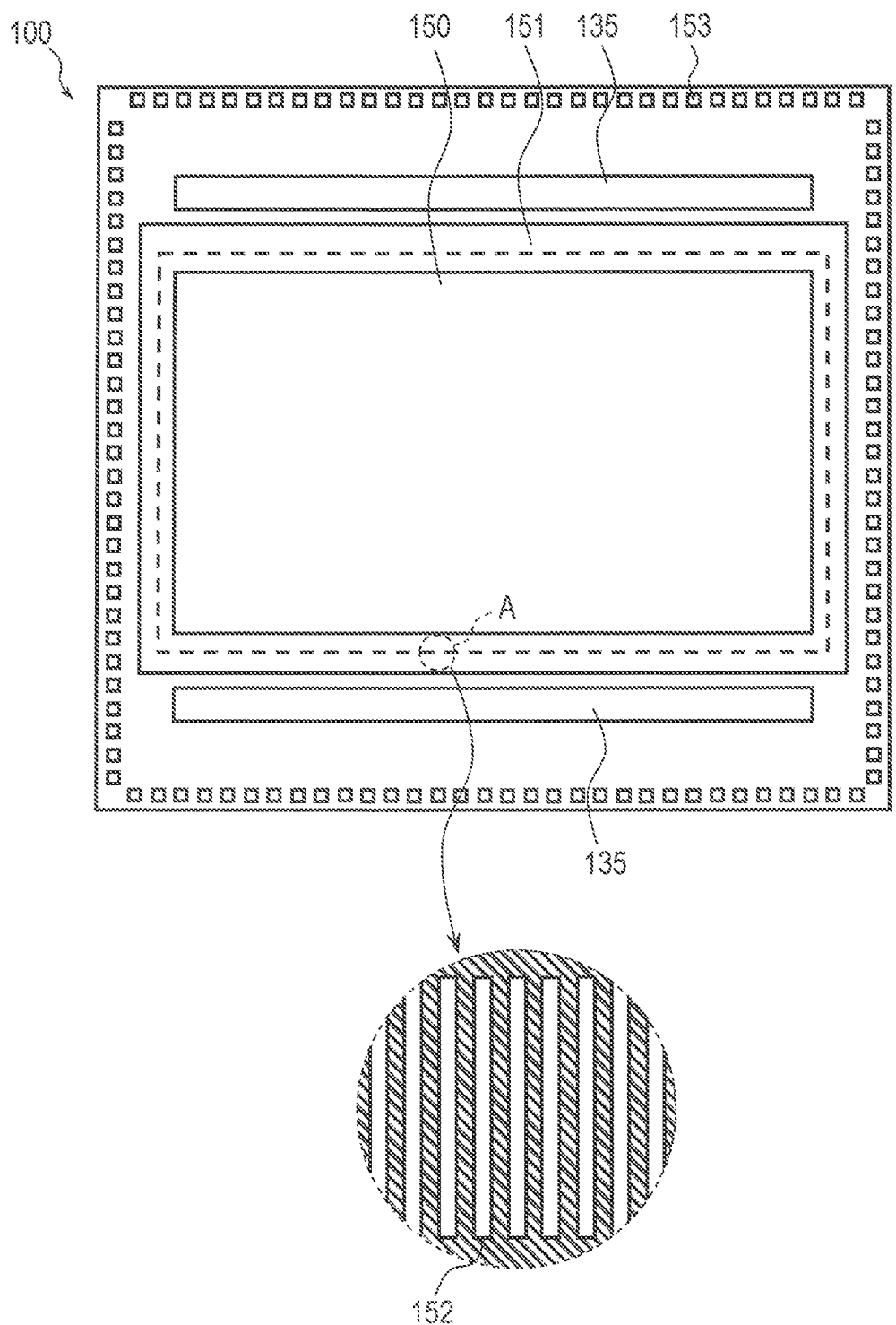
FIG. 9 is a plan view illustrating a schematic configuration of a semiconductor device according to a third embodiment of the present invention.

A semiconductor device according to a third embodiment of the present invention will be described with reference to FIG. 9. Components similar to those of the semiconductor device according to the first and second embodiments are denoted by the same reference numerals, and descriptions thereof are omitted or simplified. FIG. 9 is a plan view illustrating the structure of the semiconductor device according to the present embodiment.

The semiconductor device according to the present embodiment is similar to the semiconductor device according to the first and second embodiments except that the planar layout of the openings 152 is different. In the first and second embodiments, square shaped openings 152 having a side of 10 μm are arranged so as to surround the pixel region 150 at a pitch of 20 μm. On the other hand, in the present embodiment, rectangular openings 152 having a short side of 10 μm and a long side of 200 μm are arranged so as to surround the pixel region 150 at a pitch of 10 μm.

By forming the opening 152 into a rectangular shape as in the present embodiment, the contact area between the transparent electrode 134 and the interconnection 140 is increased, and the connection resistance between the transparent electrode 134 and the interconnection 140 may be further reduced. As a result, the transparent electrode 134 and the control electrode 135 may be connected to each other with a lower resistance, and the increased speed and the reduced power consumption of the semiconductor device as compared with the second embodiment may be achieved.

Also in the present embodiment, the size of the openings 152 in plan view is set to a size that may suppress deformation of the functional layer 133 when heat is applied to the functional layer 133, specifically, the length or diameter of one side is set to not more than 250 μm. In order to further enhance the heat resistance, the length or diameter of the long side of the opening 152 is preferably set to not more than 30 μm.

Further, it is desirable that the total area of the plurality of openings 152 in a plan view is not more than 10% of the area of the pixel region 150 in a plan view. In order to further enhance heat resistance, it is more preferable to set the total area of the openings 152 in a plan view to not more than 6% of the area of the pixel region 150 in a plan view. The smaller the ratio of the total area of the plurality of openings 152 to the area of the pixel region 150, the higher the heat resistance can be. In the present embodiment, the pixel region 150 has a short side of 5700 μm and a long side of 10,000 μm, and the total area of the plurality of openings 152 is about 5.9% of the area of the pixel region 150.

The size, pitch, and two-dimensional arrangement of the openings 152 may be appropriately set within a range satisfying these conditions.

As described above, according to the present embodiment, it is possible to suppress the characteristic deterioration of the functional element constituting the semiconductor device.

Fourth Embodiment

Figure 10:
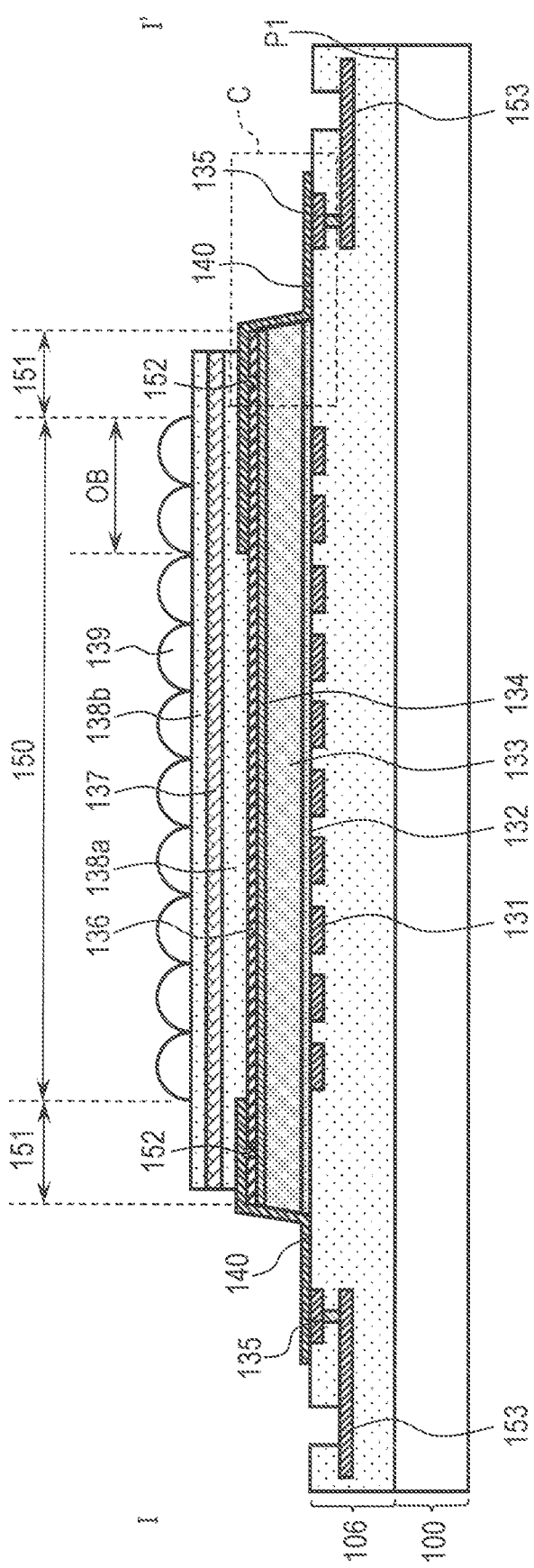
FIG. 10 is a schematic cross-sectional view of a semiconductor device according to a fourth embodiment of the present invention.
Figure 11A:
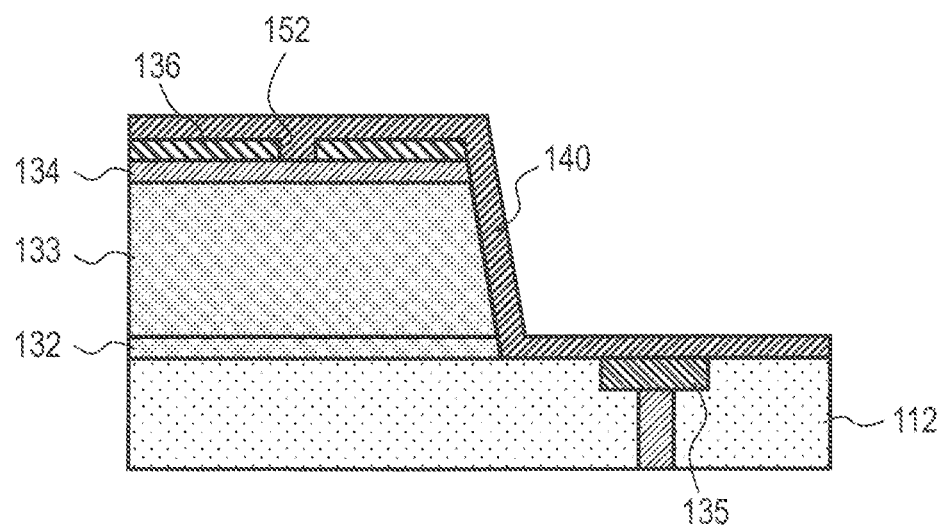
FIGS. 11A and 11B are enlarged cross-sectional views of a connection region of the semiconductor device according to the fourth embodiment of the present invention.
Figure 11B:
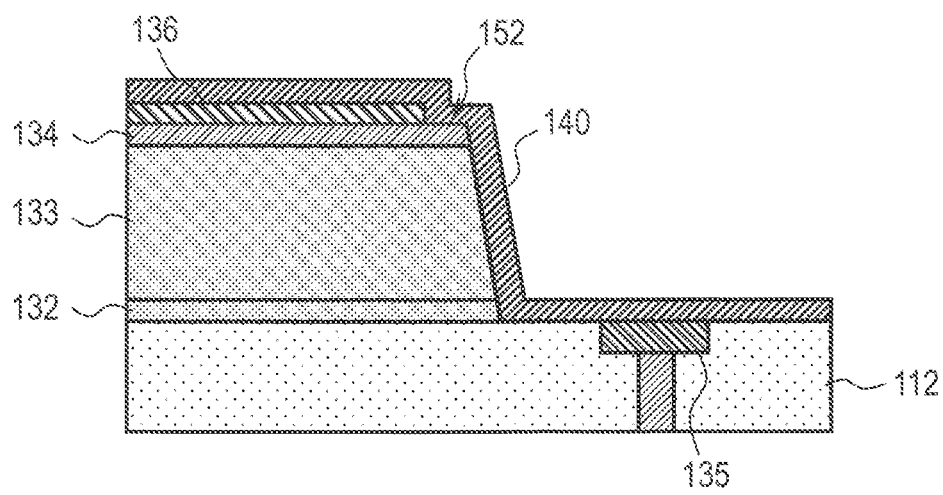

A semiconductor device according to a fourth embodiment of the present invention will be described with reference to FIG. 10 to FIG. 11B. Components similar to those of the semiconductor device according to the first to third embodiments are denoted by the same reference numerals, and descriptions thereof are omitted or simplified. FIG. 10 is a schematic cross-sectional view illustrating a configuration example of the semiconductor device according to the present embodiment, and corresponds to the I-I' line cross-sectional view of FIG. 1. FIG. 11A and FIG. 11B are partial cross-sectional views of area C of FIG. 10.

The semiconductor device according to the present embodiment differs from the semiconductor devices according to the first to third embodiments in that, as illustrated in FIG. 10 to FIG. 11B, the insulating layer 136 is not provided in a region excluding the pixel region 150 and the connection region 151. That is, in the present embodiment, although the insulating layer 136 is provided over the upper surface of the transparent electrode 134, it is not provided over the side surfaces of the transparent electrode 134, the functional layer 133, and the intermediate layer 132, and over the interconnection structure 106 in a region other than the pixel region 150 and the connection region 151. That is, the insulating layer 136 is provided so as to cover a portion opposing to the plurality of pixel electrodes 131 with the functional layer 133 interposed therebetween.

The transparent electrode 134 and the interconnection 140 are electrically connected through the openings 152 provided in the insulating layer 136. The transparent electrode 134 and the interconnection 140 may be in direct contact with each other on the side surface of the transparent electrode 134. The openings 152 may reach the upper surface of the transparent electrode 134, may be separated from the end of the transparent electrode 134 as illustrated in FIG. 11A, or may be provided at the end of the transparent electrode 134 as illustrated in FIG. 11B.

The interconnection 140 is provided so as to cover a part of the upper surface and the side surface of the laminate including the intermediate layer 132, the functional layer 133, the transparent electrode 134, and the insulating layer 136. With such a configuration, the interconnection 140, like the insulating layer 136 in the first to third embodiments, may have a function of suppressing deformation of the functional layer 133 such as film floating or film peeling.

Further, since the interconnection 140 covers the side surfaces of the transparent electrode 134, the functional layer 133, and the intermediate layer 132, it is possible to suppress external moisture from reaching the light detecting element (functional layer 133) and to improve sealing performance. The interconnection 140 may be in contact with the side surfaces of the transparent electrode 134, the functional layer 133 and the intermediate layer 132. Alternatively, a film other than the insulating layer 136 may be interposed between the interconnection 140 and the side surfaces of the transparent electrode 134, the functional layer 133 and the intermediate layer 132.

Here, a portion located on the upper surface side of the insulating layer 136 is referred to as a first portion of the interconnection 140, and a portion located on the side surfaces of the transparent electrode 134, the functional layer 133, and the intermediate layer 132 is referred to as a second portion of the interconnection 140. In this case, the transparent electrode 134 is located between the first portion of the interconnection 140 and the functional layer 133. The distance A between the first part of the interconnection 140 and the transparent electrode 134 and the distance B between the second part of the interconnection 140 and the functional layer 133 are smaller than the distance C between the first part of the interconnection 140 and the functional layer 133. The transparent electrode 134 and the control electrode 135 are electrically connected via the interconnection 140.

Note that, depending on the combination of the materials of the interconnection 140 and the functional layer 133, the leakage current between the interconnection 140 and the functional layer 133 may degrade the characteristics of the light detecting element. From the viewpoint of reducing such leakage current, it is desirable that the work function of the material constituting the interconnection 140 is larger than that of the material constituting the functional layer 133. The effect of reducing the leakage current is particularly large in the present embodiment in which the interconnection 140 is close to the side surface of the functional layer 133, but the same is true in the first to third embodiments.

For example, when the particle size of the PbS quantum dots contained in the functional layer 133 is less than 3.8 nm, since the LUMO level of the functional layer 133 is shallower than 4.2 eV, a material having a work function greater than 4.2 eV, for example, Al or AlCu, is preferable as the constituent material of the interconnection 140. When the particle size of the PbS quantum dot is not less than 3.8 nm and less than 4.3 nm, the LUMO level of the functional layer 133 is shallower than 4.3 eV, so that a material having a work function larger than 4.3 eV, for example, Ti or W, is preferable as the constituent material of the interconnection 140. When the particle size of the PbS quantum dot is not less than 4.3 nm, the LUMO level of the functional layer 133 is shallower than 4.7 eV, so that a material having a work function larger than 4.7 eV, for example, Au or ITO, is preferable as the constituent material of the interconnection 140. In the case where the quantum dots of the functional layer 133 are made of other materials, the material of the interconnection 140 may be selected by the same method.

As the constituent material of the interconnection 140, metals, alloys, and nitrides thereof may be mentioned. Examples of the metal material include Ti (4.3 eV), Al (4.2 eV), Cu (4.9 eV), W (4.6 eV), Au (4.5 eV), Ag (4.3 eV), Ni (4.5 eV), and Co (5 eV). Examples of the alloy material include AlSiCu and the like. Examples of the nitride include TiN (4.33 eV). The numerical values in parentheses are work functions of these materials.

From the viewpoint of reducing the connection resistance between the transparent electrode 134 and the control electrode 135, and from the viewpoint of being usable as a light-shielding layer, it is further preferable to select the interconnection 140 from a material having a resistivity about two orders lower than that of the transparent electrode 134 and having light-shielding property.

Further, the functional layer 133 may be oxidized to provide a composition change portion on the side surface portion of the functional layer 133. With this configuration, the leakage current between the interconnection 140 and the functional layer 133 may be further reduced.

As described above, according to the present embodiment, it is possible to suppress the characteristic deterioration of the functional element constituting the semiconductor device.

Fifth Embodiment

Figure 12:
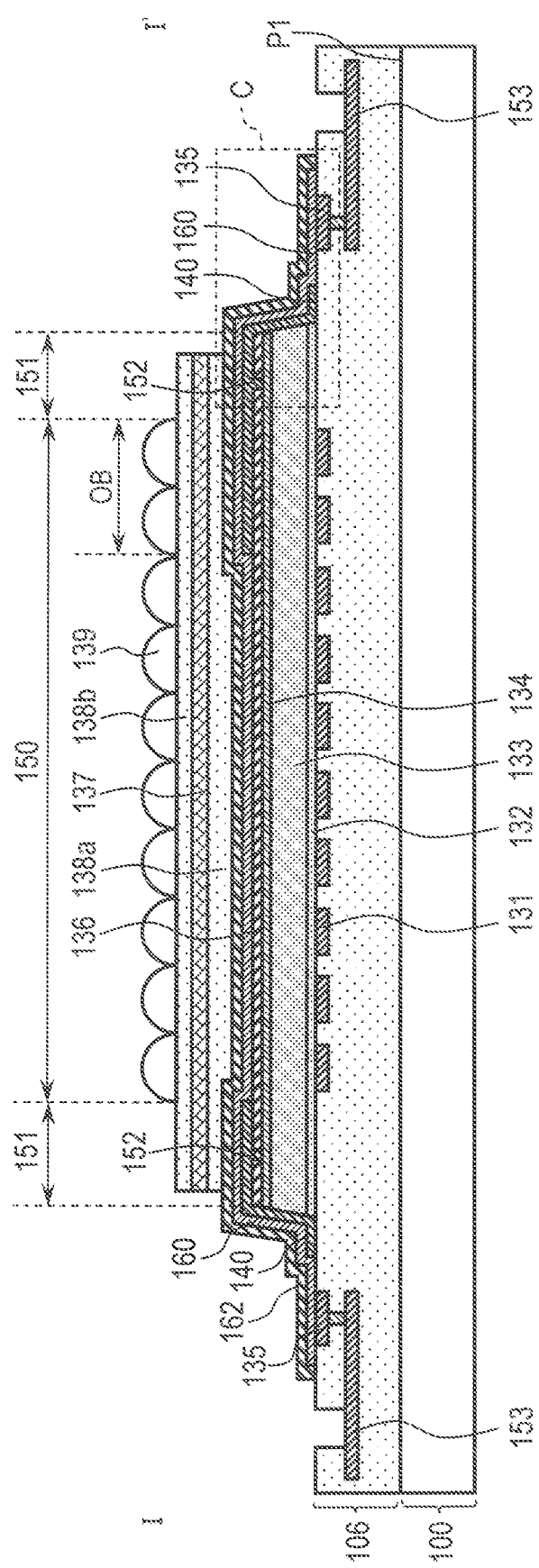
FIG. 12 is a schematic cross-sectional view of a semiconductor device according to a fifth embodiment of the present invention.
Figure 13:
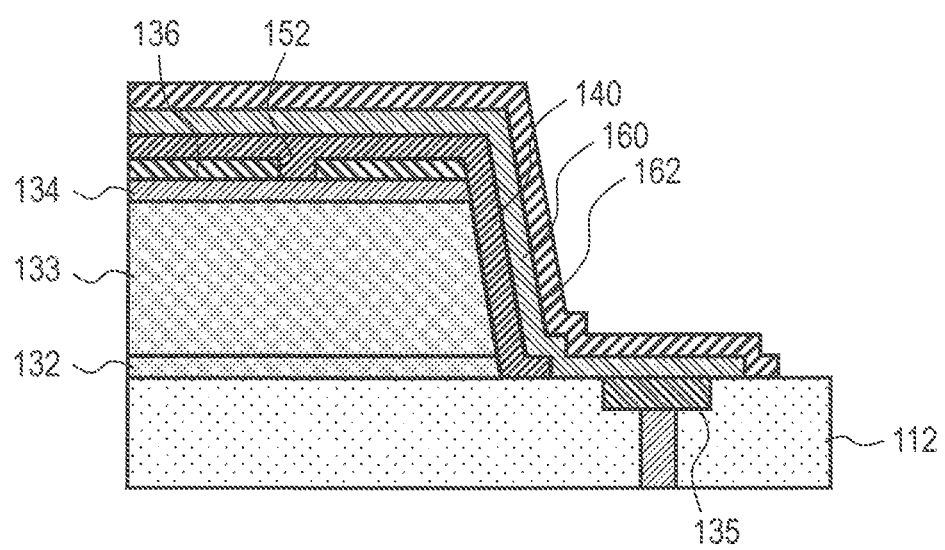
FIG. 13 is an enlarged cross-sectional view of a connection region of a semiconductor device according to the fifth embodiment of the present invention.

A semiconductor device according to a fifth embodiment of the present invention will be described with reference to FIG. 12 and FIG. 13. Components similar to those of the semiconductor device according to the first to fourth embodiments are denoted by the same reference numerals, and descriptions thereof are omitted or simplified. FIG. 12 is a schematic cross-sectional view illustrating a configuration example of the semiconductor device according to the present embodiment, and corresponds to the I-I' line cross-sectional view of FIG. 1. FIG. 13 is a partial cross-sectional view of area C in FIG. 12.

As illustrated in FIG. 12 and FIG. 13, the semiconductor device according to the present embodiment is similar to the fourth embodiment in that the insulating layer 136 is not provided in a region except for the pixel region 150 and the connection region 151. Further, in the semiconductor device according to the present embodiment, the transparent electrode 160 (second) and the insulating layer 162 (second) are further provided between the insulating layer 136 and the planarization layer 138a, and between the interconnection 140 and the planarization layer 138a.

The interconnection 140 is connected to the transparent electrode 134 through the openings 152 as in the previous embodiments, but does not extend over the control electrode 135 and is not directly connected to the control electrode 135. The transparent electrode 160 covers the insulating layer 136 and the interconnection 140 in the pixel region 150 and the connection region 151, extends over the control electrode 135, and is connected to the control electrode 135. That is, the transparent electrode 134 and the control electrode 135 are electrically connected via the interconnection 140 and the transparent electrode 160. The insulating layer 162 is provided so as to cover the entire surface of the transparent electrode 160 and may function as a protective film.

With this structure, the side surface of the functional layer 133 is covered with the interconnection 140, the transparent electrode 160, and the insulating layer 162, so that the intrusion of moisture from the outside may be more effectively suppressed. Further, by using the interconnection 140 as a part of the electrical connection path between the transparent electrode 134 and the control electrode 135, the connection resistance between the transparent electrode 134 and the control electrode 135 may be reduced.

In the present embodiment, the transparent electrode 160 is provided over the pixel region 150, and the transparent electrode 160 is provided over the pixel region, but the transparent electrode 160 over the pixel region 150 is not necessarily provided. The pixel region 150 may have at least a role of electrically connecting the interconnection 140 and the control electrode 135.

As described above, according to the present embodiment, it is possible to suppress the characteristic deterioration of the functional element constituting the semiconductor device.

Sixth Embodiment

Figure 14:
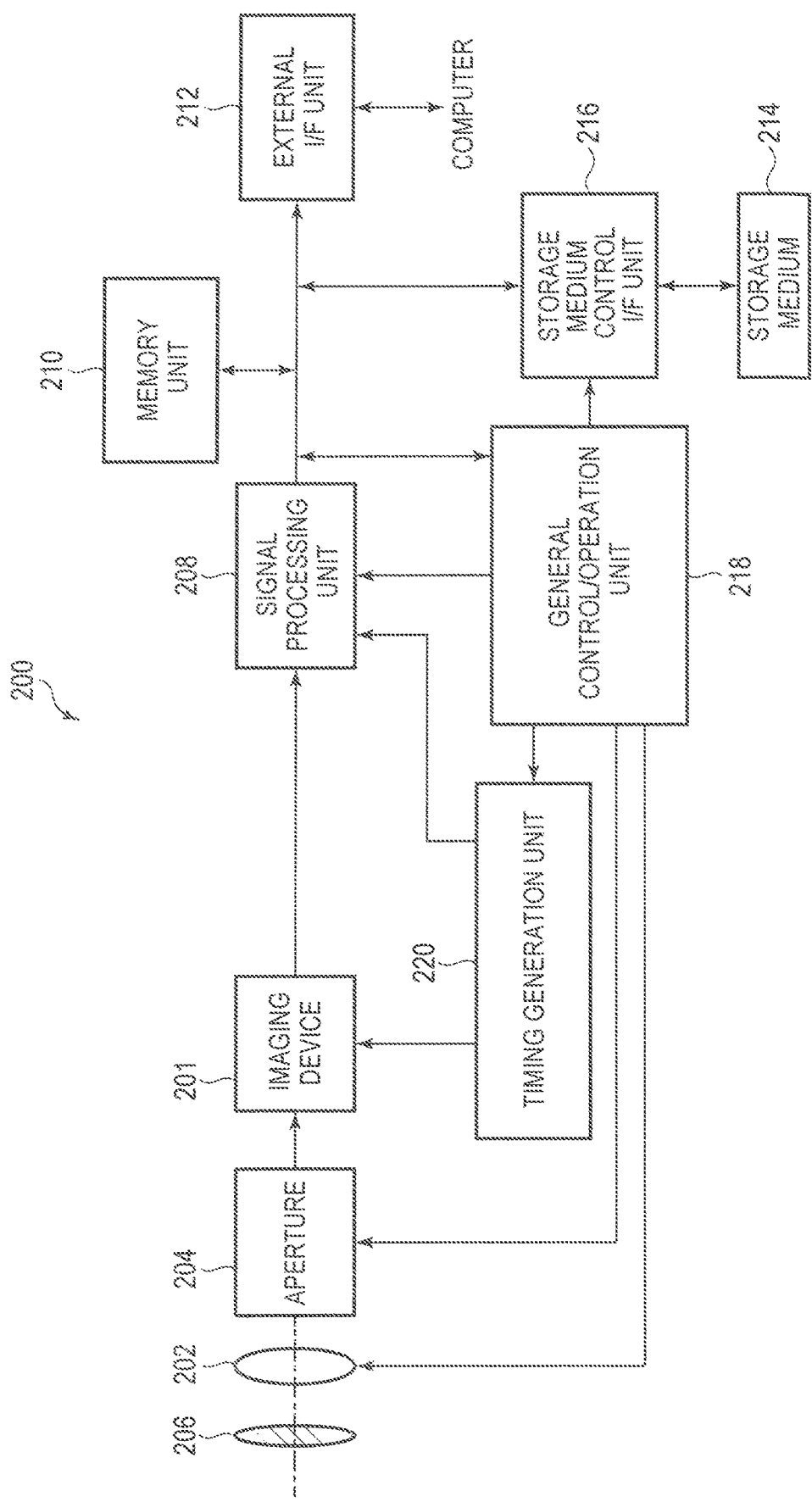
FIG. 14 is a block diagram illustrating a schematic configuration of an imaging system according to a sixth embodiment of the present invention.

An imaging system according to a sixth embodiment of the present invention will be described with reference to FIG. 14. FIG. 14 is a block diagram illustrating a schematic configuration of an imaging system according to the present embodiment.

The semiconductor devices described in the first to fifth embodiments are applicable to various imaging systems. Examples of applicable imaging systems may include digital still cameras, digital camcorders, surveillance cameras, copying machines, fax machines, cellular phones, on-vehicle cameras, observation satellites, and the like. A camera module including an optical system such as a lens and an imaging device is also included in the imaging system. FIG. 14 illustrates a block diagram of a digital still camera as an example out of these examples.

The imaging system 200 illustrated in FIG. 14 includes an imaging device 201, a lens 202 for forming an optical image of an object onto the imaging device 201, an aperture 204 for varying the quantity of light passing through the lens 202, and a barrier 206 for protecting the lens 202. The lens 202 and the aperture 204 form an optical system that collects a light onto the imaging device 201. The imaging device 201 is the semiconductor device described in any of the first to fifth embodiments, and converts an optical image formed by the lens 202 into image data.

Further, the imaging system 200 also includes a signal processing unit 208 that processes a signal output from the imaging device 201. The signal processing unit 208 generates image data from digital signals output from the imaging device 201. Further, the signal processing unit 208 performs operations of performing various corrections and compresses as necessary to output image data. The imaging device 201 may include an AD converter for generating a digital signal to be processed by the signal processing unit 208. The AD converter may be formed on a semiconductor layer (semiconductor substrate) in which the photoelectric converter of the imaging device 201 is formed, or may be formed on a semiconductor substrate different from the semiconductor layer in which the photoelectric converter of the imaging device 201 is formed. Further, the signal processing unit 208 may be formed on the same semiconductor substrate as the imaging device 201.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data, and a storage medium control interface unit (storage medium control I/F unit) 216 for performing storage or readout the imaging data on the storage medium 214. The storage medium 214 may be embedded in the imaging system 200 or may be removable.

Furthermore, the imaging system 200 further includes a general control/operation unit 218 that performs various calculation and controls the entire digital still camera, and a timing generation unit 220 that outputs various timing signals to the imaging device 201 and the signal processing unit 208. Here, the timing signal or the like may be input from the outside, and the imaging system 200 may include at least an imaging device 201 and a signal processing unit 208 that processes an output signal output from the imaging device 201.

The imaging device 201 outputs an imaging signal to the signal processing unit 208. The signal processing unit 208 performs predetermined signal processing on the imaging signal output from the imaging device 201 and outputs image data. The signal processing unit 208 generates an image by using the imaging signal.

As described above, according to the present embodiment, an imaging system to which the semiconductor device according to any of the first to fifth embodiments are applied may be realized.

Seventh Embodiment

Figure 15A:
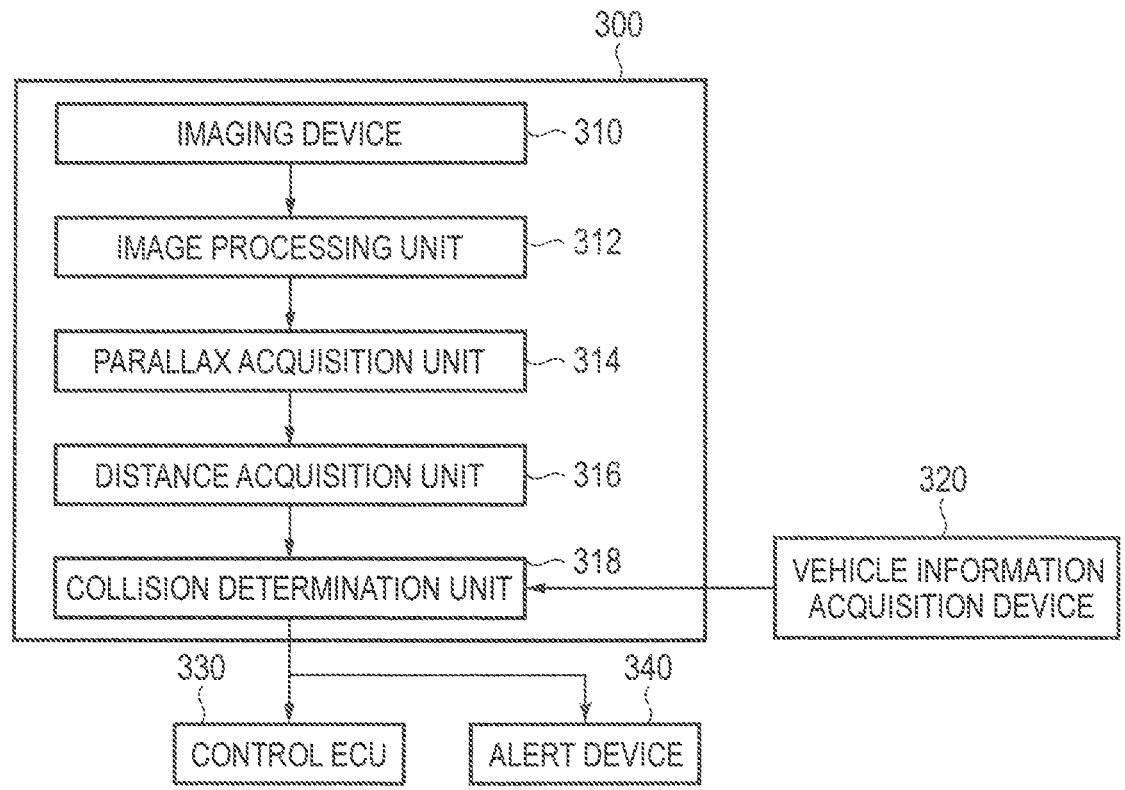
FIG. 15A is a diagram illustrating a configuration example of an imaging system according to a seventh embodiment of the present invention.
Figure 15B:
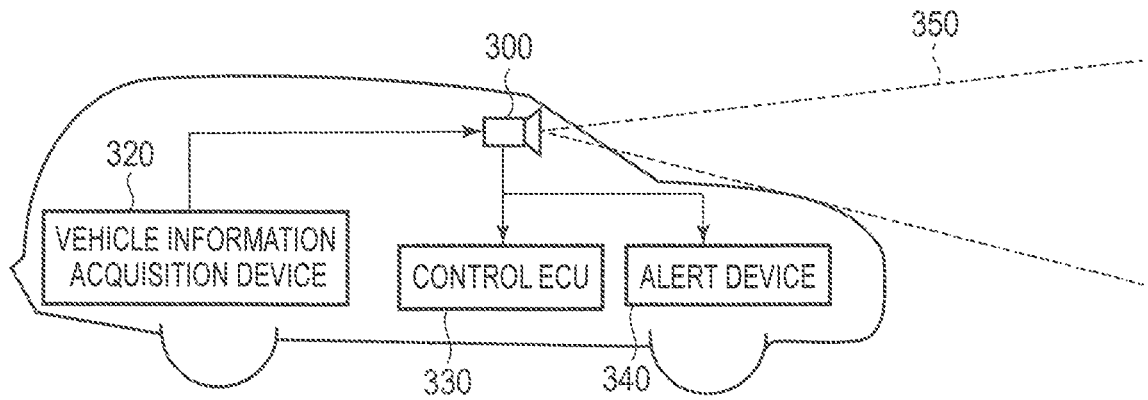
FIG. 15B is a diagram illustrating a configuration example of a movable object according to a seventh embodiment of the present invention.

An imaging system and a movable object according to a seventh embodiment of the present invention will be described with reference to FIG. 15A and FIG. 15B. FIG. 15A is a diagram illustrating a configuration of an imaging system according to the present embodiment. FIG. 15B is a diagram illustrating a configuration of a movable object according to the present embodiment.

FIG. 15A illustrates an example of an imaging system relating to an on-vehicle camera. The imaging system 300 includes an imaging device 310. The imaging device 310 may be constituted by a semiconductor device according to any one of the first to fifth embodiments. The imaging system 300 includes an image processing unit 312 that performs image processing on a plurality of image data acquired by the imaging device 310, and a parallax acquisition unit 314 that calculates a parallax (phase difference of the parallax images) from the plurality of image data acquired by the imaging system 300. Further, the imaging system 300 also includes a distance acquisition unit 316 that calculates a distance to the object based on the calculated parallax and a collision determination unit 318 that determines whether or not there is a possibility of collision based on the calculated distance. Here, the parallax acquisition unit 314 and the distance acquisition unit 316 are examples of distance information acquisition unit that acquires distance information to the object. That is, the distance information is information relating to parallax, defocus amount, distance to the object, and the like. The collision determination unit 318 may determine the possibility of collision using any of the distance information. The distance information acquisition means may be implemented by dedicatedly designed hardware or a software module. Further, it may be realized by an FPGA (Field Programmable Gate Array), an ASIC (Application Specific Integrated Circuit) or the like, or a combination thereof.

The imaging system 300 is connected to a vehicle information acquisition device 320, and can acquire vehicle information such as a vehicle speed, a yaw rate, a steering angle, or the like. Further, the imaging system 300 is connected to a control ECU 330 which is a control device that outputs a control signal causing a vehicle to generate braking force based on the determination result by the collision determination unit 318. Further, the imaging system 300 is also connected to an alert device 340 that issues an alert to the driver based on the determination result by the collision determination unit 318. For example, when the collision probability is high as the determination result by the collision determination unit 318, the control ECU 330 performs vehicle control to avoid the collision and reduce damage by applying a brake, pushing back an accelerator, suppressing engine power, or the like. The alert device 340 alerts a user by sounding an alert such as a sound, displaying alert information on a display of a car navigation system, or the like, providing vibration to a seat belt or a steering wheel, or the like.

In the present embodiment, the periphery of the vehicle, for example, the front area or rear area, is captured by using the imaging system 300. FIG. 15B illustrates the imaging system when a front area of the vehicle (a capturing area 350) is captured. The vehicle information acquisition device 320 transmits an instruction to the imaging system 300 or the imaging device 310. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the above-described embodiment, and various modifications are possible.

For example, an example in which a part of the configuration of any of the embodiment is added to another embodiment or an example in which a part of the configuration of any of the embodiment is replaced with a part of the configuration of another embodiment is also one of the embodiments of the present invention.

Further, the numerical values, shapes, materials, components, arrangement of the components, connection relation between the components and the like described in the above embodiments are examples of the configuration of the present invention, and the present invention is not limited to the examples described in the embodiments.

The imaging systems illustrated in the sixth and seventh embodiments are examples of systems to which the semiconductor device of the present invention may be applied, and the systems to which the semiconductor device of the present invention may be applied are not limited to the imaging systems illustrated in FIG. 14 and FIG. 15A. For example, when the functional element including the functional layer 133 is a light emitting element, it is possible to form a light emitting device having a semiconductor light emitting element array and to constitute an exposure head of the image forming apparatus.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to explicit embodiments, it is to be explicit that the invention is not limited to the disclosed explicit embodiments. The scope of the following claims is to be agreed the broadest interpretation so as to encode pass all such modifications and equivalent structures and functions.

This application claims the benefit of Japanese Patent Application No. 2020-103581, filed Jun. 16, 2020, which is hereby incorporated by reference herein in its entirety.

What is claimed is:

1. A semiconductor device, comprising:
a substrate provided with a plurality of pixel electrodes and a control electrode;
a functional layer provided over the plurality of pixel electrodes;
a transparent electrode provided over the functional layer;
an insulating layer provided so as to cover an upper surface and a side surface of a laminate including the functional layer and the transparent electrode, and having a first opening reaching the transparent electrode;
a light-shielding conductive layer provided so as to cover the side surface of the laminate with the insulating layer interposed therebetween, and
a microlens layer provided over the transparent electrode and including a plurality of microlenses, wherein
the light-shielding layer is electrically connected to the transparent electrode through the first opening and is at least a part of a path electrically connecting the transparent electrode and the control electrode, and
at least a part of the plurality of pixel electrodes, at least a part of the light-shielding conductive layer and at least a part of the plurality of microlenses overlap in a plan view.

2. The semiconductor device according to claim 1, wherein the insulating layer comprises a second opening extending over the control electrode and reaching the control electrode, and
the light-shielding conductive layer is electrically connected to the control electrode through the second opening.

3. A semiconductor device, comprising:
a substrate provided with a plurality of pixel electrodes and a control electrode;
a functional layer provided over the plurality of pixel electrodes;
a first transparent electrode provided over the functional layer;
an insulating layer provided over the first transparent electrode; and
a light-shielding conductive layer provided to cover a part of an upper surface and a side surface of a laminate including the functional layer, the first transparent electrode and the insulating layer; and
a microlens layer provided over the first transparent electrode and including a plurality of microlenses;
the light-shielding conductive layer having a first portion positioned on a side of the upper surface of the laminate and a second portion positioned on a side of the side surface of the laminate; and the first transparent electrode being positioned between the first portion of the light-shielding conductive layer and the functional layer, wherein a distance A between the first portion of the light-shielding conductive layer and the first transparent electrode and a distance B between the second portion of the light-shielding conductive layer and the functional layer are both smaller than a distance C between the first portion of the light-shielding conductive layer and the functional layer, the first transparent electrode and the control electrode are electrically connected via the light-shielding conductive layer, the light-shielding conductive layer comprises a first light-shielding conductive layer and a second light-shielding conductive layer, and the control electrode comprises a first control electrode and a second control electrode, the first transparent electrode is connected to the first control electrode via the first light-shielding conductive layer, and is connected to the second control electrode via the second light-shielding conductive layer, and at least a part of the plurality of pixel electrodes, at least a part of the light-shielding conductive layer and at least a part of the plurality of microlenses overlap in a plan view.

4. The semiconductor device according to claim 3, wherein the first portion of the light-shielding conductive layer contacts the first transparent electrode.

5. The semiconductor device according to claim 3, wherein the second portion of the light-shielding conductive layer contacts the functional layer.

6. The semiconductor device according to claim 3, wherein the insulating layer is provided so as to cover a portion opposing to the plurality of pixel electrodes with the functional layer interposed therebetween.

7. The semiconductor device according to claim 3, further comprising a second transparent electrode provided over the light-shielding conductive layer; and a second insulating layer provided over the second transparent electrode, wherein the second transparent electrode is connected to the control electrode, and the first transparent electrode and the control electrode are electrically connected via the light-shielding conductive layer and the second transparent electrode.

8. The semiconductor device according to claim 3, wherein a side surface of the functional layer is oxidized.

9. The semiconductor device according to claim 3, wherein the insulating layer has a first opening reaching the first transparent electrode, and the light-shielding conductive layer and the first transparent electrode are electrically connected through the first opening.

10. The semiconductor device according to claim 1, wherein a connection region comprising the first opening is arranged to surround a pixel region comprising the plurality of pixel electrodes.

11. The semiconductor device according to claim 1, wherein the first opening comprises a plurality of openings.

12. The semiconductor device according to claim 11, wherein a total area of the plurality of openings is not more than 10% of an area of a pixel region in which the plurality of pixel electrodes is provided.

13. The semiconductor device according to claim 11, wherein each of the plurality of openings has a maximum width of not more than 250 μm.

14. The semiconductor device according to claim 11, wherein the plurality of openings is provided so as to surround a pixel region comprising provided with the plurality of pixel electrodes.

15. The semiconductor device according to claim 1, wherein a work function of a material forming the light-shielding conductive layer is larger than a work function of a material forming the functional layer.

16. The semiconductor device according to claim 1, further comprising a color filter layer and a microlens layer oriented provided over the transparent electrode.

17. The semiconductor device according to claim 1, wherein the functional layer comprises nanoparticles, said nanoparticles comprising at least one semiconductor material selected from the group consisting of PbS, PbSe, PbTe, InN, InAs, InP, InSb, InGaAs, CdS, CdSe, CdTe, Ge, CuInS, CuInSe, CuInGaSe and Si.

18. The semiconductor device according to claim 1, wherein the light-shielding conductive layer comprises a metal or a metal alloy.

19. An imaging system, comprising:

the semiconductor device according to claim 1; and a signal processing unit configured to process a signal output from the semiconductor device.

20. A movable object, comprising:

the semiconductor device according to claim 1;

a distance information acquiring unit configured to acquire distance information to an object from a parallax image based on a signal output from the semiconductor device; and a control unit configured to control the movable object based on the distance information.

21. The semiconductor device according to claim 1, wherein the light-shielding conductive layer comprises a first light-shielding conductive layer and a second light-shielding conductive layer, and the control electrode comprises a first control electrode and a second control electrode, and the first transparent electrode is connected to the first control electrode via the first light-shielding conductive layer, and is connected to the second control electrode via the second light-shielding conductive layer.

22. The semiconductor device according to claim 1, wherein the light-shielding conductive layer is configured to shield an incident light to the functional layer.

23. The semiconductor device according to claim 3, wherein the light-shielding conductive layer is configured to shield an incident light to the functional layer.

* * * * *